(12) United States Patent
Tian et al.

(10) Patent No.: US 10,714,963 B2
(45) Date of Patent: *Jul. 14, 2020

(54) CHARGING SYSTEM, CHARGING METHOD, AND DEVICE

(71) Applicant: GUANGDONG OPPO MOBILE TELECOMMUNICATIONS CORP., LTD., Dongguan, Guangdong (CN)

(72) Inventors: Chen Tian, Guangdong (CN); Jialiang Zhang, Guangdong (CN)

(73) Assignee: GUANGDONG OPPO MOBILE TELECOMMUNICATIONS CORP., LTD., Dongguan, Guangdong (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/562,690

(22) Filed: Sep. 6, 2019

(65) Prior Publication Data

US 2019/0393716 A1 Dec. 26, 2019

Related U.S. Application Data

(63) Continuation of application No. 16/063,268, filed as application No. PCT/CN2017/070530 on Jan. 7, (Continued)

(30) Foreign Application Priority Data

Jul. 26, 2016 (CN) .......................... 2016 1 0600612

(51) Int. Cl.
  *H02J 7/00* (2006.01)
  *H02J 7/02* (2016.01)
  (Continued)

(52) U.S. Cl.
  CPC .......... *H02J 7/027* (2013.01); *G01R 31/3842* (2019.01); *H01M 10/0525* (2013.01);
  (Continued)

(58) Field of Classification Search
  USPC ................................................. 320/128, 134
  See application file for complete search history.

(56) References Cited

U.S. PATENT DOCUMENTS

| 4,087,733 A * | 5/1978 | Casagrande | ............ H02J 7/008 320/143 |
| 5,382,893 A * | 1/1995 | Dehnel | ................... H02J 7/008 307/66 |

(Continued)

FOREIGN PATENT DOCUMENTS

| CN | 1404649 A | 3/2003 |
| CN | 101022179 A | 8/2007 |

(Continued)

OTHER PUBLICATIONS

Chinese Patent Application No. 201780003822.7 English translation of Office Action dated Feb. 3, 2019, 6 pages.

(Continued)

*Primary Examiner* — Samuel Berhanu
(74) *Attorney, Agent, or Firm* — Lathrop GPM LLP

(57) ABSTRACT

Provided are a charging system, charging method, and device, said charging system comprising a battery; a first rectifier, configured to output a first voltage with a first pulsating waveform; a switch unit, configured to modulate the first voltage; a transformer, configured to output a second voltage with a second pulsating waveform; a second rectifier, configured to output a third voltage with a third pulsating waveform, and the third voltage is configured to be applied to the battery charge the battery; a first current sampling circuit, configured to sample current to obtain a current sampling value; and a control unit configured to output the control signal to the switch unit, adjust the amplification factor of the operational amplifier, and adjust a duty ratio of the control signal according to the current sampling value, such that the third voltage meets a charging requirement of the battery.

20 Claims, 12 Drawing Sheets

Related U.S. Application Data 2017, which is a continuation-in-part of application No. PCT/CN2016/073679, filed on Feb. 5, 2016.

(51) Int. Cl.
| | |
|---|---|
| G01R 31/3842 | (2019.01) |
| H02M 3/335 | (2006.01) |
| H02J 7/04 | (2006.01) |
| H02M 7/217 | (2006.01) |
| H02J 7/06 | (2006.01) |
| H02M 1/08 | (2006.01) |
| H02M 7/06 | (2006.01) |
| H01M 10/0525 | (2010.01) |
| H01M 10/42 | (2006.01) |
| H01M 10/44 | (2006.01) |
| H02M 1/44 | (2007.01) |
| H02M 5/04 | (2006.01) |
| H02M 7/04 | (2006.01) |
| H02M 1/00 | (2006.01) |
| H02J 7/10 | (2006.01) |

(52) U.S. Cl.
CPC ......... *H01M 10/425* (2013.01); *H01M 10/44* (2013.01); *H02J 7/00* (2013.01); *H02J 7/007* (2013.01); *H02J 7/008* (2013.01); *H02J 7/0029* (2013.01); *H02J 7/0031* (2013.01); *H02J 7/0071* (2020.01); *H02J 7/00711* (2020.01); *H02J 7/007192* (2020.01); *H02J 7/022* (2013.01); *H02J 7/04* (2013.01); *H02J 7/045* (2013.01); *H02J 7/06* (2013.01); *H02M 1/08* (2013.01); *H02M 1/44* (2013.01); *H02M 3/335* (2013.01); *H02M 3/33507* (2013.01); *H02M 3/33523* (2013.01); *H02M 3/33569* (2013.01); *H02M 3/33576* (2013.01); *H02M 3/33592* (2013.01); *H02M 5/04* (2013.01); *H02M 7/04* (2013.01); *H02M 7/06* (2013.01); *H02M 7/217* (2013.01); *H01M 10/4257* (2013.01); *H01M 2010/4271* (2013.01); *H02J 7/00034* (2020.01); *H02J 7/00304* (2020.01); *H02J 2207/10* (2013.01); *H02J 2207/10* (2020.01); *H02J 2207/20* (2020.01); *H02M 2001/0009* (2013.01)

(56) References Cited

U.S. PATENT DOCUMENTS

| | | | |
|---|---|---|---|
| 6,025,695 A * | 2/2000 | Friel | H01M 10/4257 112/130 |
| 6,137,265 A | 10/2000 | Cummings et al. | |
| 6,909,617 B1 | 6/2005 | Mirskiy | |
| 2003/0151928 A1 | 8/2003 | Kobori et al. | |
| 2004/0090209 A1 | 5/2004 | Nishida et al. | |
| 2004/0095020 A1 | 5/2004 | Kernahan et al. | |
| 2004/0189251 A1 | 9/2004 | Kutkut et al. | |
| 2006/0164044 A1 | 7/2006 | Keat et al. | |
| 2006/0284595 A1 * | 12/2006 | Hsieh | H02J 7/0077 320/115 |
| 2008/0197811 A1 | 8/2008 | Hartular et al. | |
| 2011/0026275 A1 | 2/2011 | Huang et al. | |
| 2011/0101910 A1 | 5/2011 | Li et al. | |
| 2012/0161712 A1 | 6/2012 | Saito | |
| 2012/0262950 A1 | 10/2012 | Nate et al. | |
| 2013/0027983 A1 | 1/2013 | Nate et al. | |
| 2013/0141034 A1 | 6/2013 | Huang et al. | |
| 2014/0028250 A1 | 1/2014 | Nishino | |
| 2014/0159641 A1 | 6/2014 | Geren | |
| 2014/0160804 A1 | 6/2014 | Sato et al. | |
| 2014/0160808 A1 | 6/2014 | Sato | |
| 2014/0313782 A1 | 10/2014 | Shen et al. | |
| 2014/0355308 A1 | 12/2014 | Uan-Zo-Li et al. | |
| 2015/0123615 A1 | 5/2015 | Yang | |
| 2015/0180356 A1 | 6/2015 | Norisada et al. | |

FOREIGN PATENT DOCUMENTS

| | | |
|---|---|---|
| CN | 101312297 A | 11/2008 |
| CN | 101431250 A | 5/2009 |
| CN | 101572496 A | 11/2009 |
| CN | 101706558 A | 5/2010 |
| CN | 101867295 A | 10/2010 |
| CN | 202026118 U | 11/2011 |
| CN | 102545360 A | 7/2012 |
| CN | 202616850 U | 12/2012 |
| CN | 102916595 A | 2/2013 |
| CN | 103036437 A | 4/2013 |
| CN | 102364856 B | 10/2013 |
| CN | 103762702 A | 4/2014 |
| CN | 103795040 A | 5/2014 |
| CN | 203747451 U | 7/2014 |
| CN | 104022634 A | 9/2014 |
| CN | 203827185 U | 9/2014 |
| CN | 204118838 U | 1/2015 |
| CN | 104362842 A | 2/2015 |
| CN | 104810877 A | 7/2015 |
| CN | 104810879 A | 7/2015 |
| CN | 104917222 A | 9/2015 |
| CN | 104917267 A | 9/2015 |
| CN | 104917271 A | 9/2015 |
| CN | 104967199 A | 10/2015 |
| CN | 104967201 A | 10/2015 |
| CN | 105048613 A | 11/2015 |
| CN | 105098900 A | 11/2015 |
| CN | 105098945 A | 11/2015 |
| CN | 204858705 U | 12/2015 |
| CN | 106026327 A | 10/2016 |
| CN | 106253423 A | 12/2016 |
| EP | 2228884 A2 | 9/2010 |
| EP | 2804287 A1 | 11/2014 |
| EP | 2887492 A2 | 6/2015 |
| EP | 2919358 A1 | 9/2015 |
| EP | 2930589 A1 | 10/2015 |
| EP | 2980958 A1 | 2/2016 |
| FR | 2764134 A1 | 12/1998 |
| JP | S5441434 A | 4/1979 |
| JP | S58105743 U | 7/1983 |
| JP | H03189569 A | 8/1991 |
| JP | H0870575 A | 3/1996 |
| JP | 2004023894 A | 1/2004 |
| JP | 2007267501 A | 10/2007 |
| JP | 2009240001 A | 10/2009 |
| JP | 2010263734 A | 11/2010 |
| JP | 2012200781 A | 10/2012 |
| JP | 2012249410 A | 12/2012 |
| JP | 2013198262 A | 9/2013 |
| JP | 5454781 B2 | 3/2014 |
| JP | 2014138514 A | 7/2014 |
| JP | 2014516507 A | 7/2014 |
| JP | 5822304 B2 | 11/2015 |
| TW | 200616305 A | 5/2006 |
| TW | M391795 U | 11/2010 |
| TW | M481439 U | 7/2014 |
| TW | 201547175 A | 12/2015 |
| WO | WO 2012167677 A1 | 12/2012 |
| WO | WO 2015113341 A1 | 8/2015 |
| WO | WO 2015113349 A1 | 8/2015 |
| WO | WO 2016043099 A1 | 3/2016 |

OTHER PUBLICATIONS

Chinese Patent Application No. 201780003822.7 Office Action dated Feb. 3, 2019, 6 pages.
Chinese Patent Application No. 201780003822.7 English translation of Notification to Grant Patent Right for Invention dated Jun. 10, 2019, 2 pages.
Chinese Patent Application No. 201780003822.7 Notification to Grant Patent Right for Invention dated Jun. 10, 2019, 2 pages.

(56) References Cited

OTHER PUBLICATIONS

Chinese Patent Application No. 201780003822.7 Allowed Claims as of Jun. 10, 2019 with English translation Jun. 10, 2019, 31 pages.
Korean Patent Application No. 20177002310 Office Action dated Jan. 29, 2018, 5 pages.
Korean Patent Application No. 20177002310 English translation of Office Action dated Jan. 29, 2018, 3 pages.
Korean Patent Application No. 20177002310 Office Action dated Jun. 26, 2018, 3 pages.
Korean Patent Application No. 20177002310 English translation of Office Action dated Jun. 26, 2018, 3 pages.
Australian Patent Application No. 2016291545 Office Action dated Jun. 25, 2018, 6 pages.
European Patent Application No. 16819788.7 extended Search and Opinion dated Nov. 15, 2017, 7 pages.
Singapore Patent Application No. 11201700428U Search and Opinion dated Nov. 23, 2017, 9 pages.
Taiwan Patent Application No. 105120040 Office Action dated Aug. 8, 2017, 11 pages.
Taiwan Patent Application No. 105120040 Decision to Grant Patent dated Mar. 22, 2018, 2 pages.
Chen, Liang-Rui, 'A Design of an Optimal Battery Pulse Charge System by Frequency-Varied Technique', IEEE Transactions on Industrial Electronics, vol. 54, No. 1, Feb. 2007, pp. 398-405, cited in office action in AU application No. 2016291545.
Taiwan Patent Application No. 106137238 Office Action dated Dec. 3, 2018, 3 pages.
European Patent Application No. 17746709.9 extended Search and Opinion dated Jan. 2, 2019,10 pages.
Taiwan Patent Application No. 106103243 Office Action dated Sep. 28, 2017, 3 pages.
PCT/CN2017/070530 International Search Report and Written Opinion dated Mar. 30, 2017, 11 pages.
PCT/CN2017/070530 English translation of International Search Report and Written Opinion dated Mar. 30, 2017, 5 pages.
PCT/CN2016/073679 International Search Report and Written Opinion dated Nov. 10, 2016, 12 pages.
PCT/CN2016/073679 English translation of International Search Report and Written Opinion dated Nov. 10, 2016, 8 pages.
Chinese Patent Application No. 201780002055.8, Office Action dated Aug. 27, 2019, 7 pages.
Chinese Patent Application No. 201780002055.8, English translation of Office Action dated Aug. 27, 2019, 9 pages.
Chinese Patent Application No. 201810149453.9 Office Action dated Jul. 15, 2019; 5 pages.
Chinese Patent Application No. 201810149453.9 English translation of Office Action dated Jul. 15, 2019; 4 pages.
European Patent Application No. 17180971.8 extended Search and Opinion dated Dec. 21, 2017; 13 pages.
European Patent Application No. 17180971.8 Office Action dated Sep. 4, 2018; 6 pages.
European Patent Application No. 17180971.8 Office Action dated Feb. 22, 2019; 6 pages.
European Patent Application No. 17180971.8 Office Action dated Aug. 19, 2019; 7 pages.
European Patent Application No. 17746711.5 extended Search and Opinion dated Jun. 12, 2018, 10 pages.
European Patent Application No. 17746711.5 Office Action dated May 17, 2019, 5 pages.
European Patent Application No. 17746711.5, Office Action dated Oct. 22, 2019, 5 pages.
Indian Patent Application No. 201734026429 Office Action dated May 10, 2019; 7 pages.
Indian Patent Application No. 201737041037 Office Action dated Dec. 17, 2019, 6 pages.
Japanese Patent Application No. 2017-568074, Office Action dated May 29, 2018, 2 page.
Japanese Patent Application No. 2017-568074, English translation of Office Action dated May 29, 2018, 2 page.
Japanese Patent Application No. 2018-549330 Office Action dated Sep. 27, 2019, 5 pages.
Japanese Patent Application No. 2018-549330 English translation of Office Action dated Sep. 27, 2019, 4 pages.
Taiwan Patent Application No. 106103385 Office Action dated Nov. 5, 2018, 6 pages.
Taiwan Patent Application No. 106103385 English translation of Office Action dated Nov. 5, 2018, 6 pages.
Taiwanese Patent Application No. 106124354 Office Action dated Oct. 3, 2018, 9 pages.
Taiwanese Patent Application No. 106124354 English translation of Office Action dated Oct. 3, 2018, 7 pages.
PCT/CN2017/070536 International Search Report and Written Opinion dated Apr. 12, 2017, 13 pages.
PCT/CN2017/070536 English translation of International Search Report and Written Opinion dated Apr. 12, 2017, 8 pages.
PCT/CN2017/093301 English translation of the International Search Report and Written Opinion dated Sep. 22, 2017,13 pages.
U.S. Appl. No. 15/658,270 Office Action dated Nov. 29, 2018, 15 pages.
U.S. Appl. No. 15/961,764 Office Action dated Aug. 30, 2018, 25 pages.
U.S. Appl. No. 15/961,764 Notice of Allowance dated Jan. 8, 2019, 11 pages.
U.S. Appl. No. 16/502,177 Office Action dated Oct. 31, 2019, 8 pages.
Japanese Patent Application No. 2018-549330 Office Action dated Jan. 31, 2020, 5 pages.
Japanese Patent Application No. 2018-549330 English translation of Office Action dated Jan. 31, 2020, 5 pages.

\* cited by examiner

CHARGING SYSTEM, CHARGING METHOD, AND DEVICE

CROSS-REFERENCE TO RELATED APPLICATIONS

This application is a continuation application of U.S. Ser. No. 16/063,268 filed Jun. 16, 2018, which is a National Phase of International Application No. PCT/CN2017/070530, filed Jan. 7, 2017, which claims priority to Chinese Application No. 201610600612.3, filed on Jul. 26, 2016. International Application No. PCT/CN2017/070530 is also a continuation-in-part of International Application No. PCT/CN2016/073679, filed on Feb. 5, 2016.

TECHNICAL FIELD

The present disclosure generally relates to a terminal technical field, and more particularly, to a charging system, a charging method, and a device.

BACKGROUND

Nowadays, mobile terminals such as smart phones are increasingly favored by consumers. However, the mobile terminal consumes large power energy, and needs to be charged frequently.

Typically, the mobile terminal is charged by a power adapter. The power adapter generally includes a primary rectifier circuit, a primary filter circuit, a transformer, a secondary rectifier circuit, a secondary filter circuit and a control circuit, such that the power adapter converts an input alternating current of 220V into a stable and low voltage direct current (for example, 5V) suitable for requirements of the mobile terminal, and provides the direct current to a power management device and a battery of the mobile terminal, thereby realizing charging the mobile terminal.

However, as the power of the power adapter becomes larger, for example, upgrade from 5 W to 10 W, 15 W, 25 W and other larger power, more electronic elements capable of bearing large power and realizing better control are required for adaptation, which not only increases a size of the power adapter, but also increases a production cost and manufacture difficulties of the power adapter.

Further, a current detection in a related power adapter is usually realized by using a current detection resistor and an operational amplifier. Since the detected current increases as the power of the power adapter increases, there is a high requirement in a dynamic range of a current detection circuit and it is also required to prevent saturation of the operational amplifier. However, after the dynamic range of the operational amplifier is increased (for example, by selecting the current resistor with low resistance and/or decreasing an amplification factor of the amplifier), when the charging is performed with small current, it is impossible to ensure a current detection precision for the small current, thus influencing application of the power adapter.

SUMMARY

Embodiments of the present disclosure provide a charging system. The charging system includes: a battery, a first rectifier, configured to rectify an input alternating current and output a first voltage with a first pulsating waveform; a switch unit, configured to modulate the first voltage according to a control signal; a transformer, configured to output a second voltage with a second pulsating waveform according to the modulated first voltage; a second rectifier, configured to rectify the second voltage to output a third voltage with a third pulsating waveform, and the third voltage is configured to be applied to the battery charge the battery; a first current sampling circuit, configured to sample a current outputted by the second rectifier to obtain a current sampling value, in which the first current sampling circuit includes an operational amplifier with an adjustable amplification factor; and a control unit, coupled to the first current sampling circuit and the switch unit respectively, and configured to output the control signal to the switch unit, to adjust the amplification factor of the operational amplifier according to a charging mode, and to adjust a duty ratio of the control signal according to the current sampling value, such that the third voltage meets a charging requirement of the battery.

Embodiments of the present disclosure provide a device. The device includes: a first rectifier, configured to rectify an input alternating current and output a first voltage with a first pulsating waveform; a switch unit, configured to modulate the first voltage according to a control signal; a transformer, configured to output a second voltage with a second pulsating waveform according to the modulated first voltage; a second rectifier, configured to rectify the second voltage to output a third voltage with a third pulsating waveform, and the third voltage is configured to be applied to a battery in a terminal to charge the battery in the terminal when the device is coupled to the terminal; a first current sampling circuit, configured to sample a current outputted by the second rectifier to obtain a current sampling value, in which the first current sampling circuit includes an operational amplifier with an adjustable amplification factor; a control unit, coupled to the first current sampling circuit and the switch unit respectively, and configured to output the control signal to the switch unit, to adjust the amplification factor of the operational amplifier according to a charging mode, and to adjust a duty ratio of the control signal according to the current sampling value, such that the third voltage meets a charging requirement when the device is coupled to the terminal.

Embodiments of the present disclosure provide a charging method. The method includes: performing a first rectification on an input alternating current to output a first voltage with a first pulsating waveform; modulating the first voltage by controlling a switch unit, and outputting a second voltage with a second pulsating waveform by a conversion of a transformer; performing a second rectification on the second voltage to output a third voltage with a third pulsating waveform, and applying the third voltage to a battery; sampling by a first current sampling circuit a current after the second rectification to obtain a current sampling value, in which the first current sampling circuit includes an operational amplifier with an adjustable amplification factor; adjusting the amplification factor of the operational amplifier according to a charging mode, and adjusting a duty ratio of a control signal outputted to the switch unit according to the current sampling value, such that the third voltage meets a charging requirement.

DETAILED DESCRIPTION

Figure 1A:
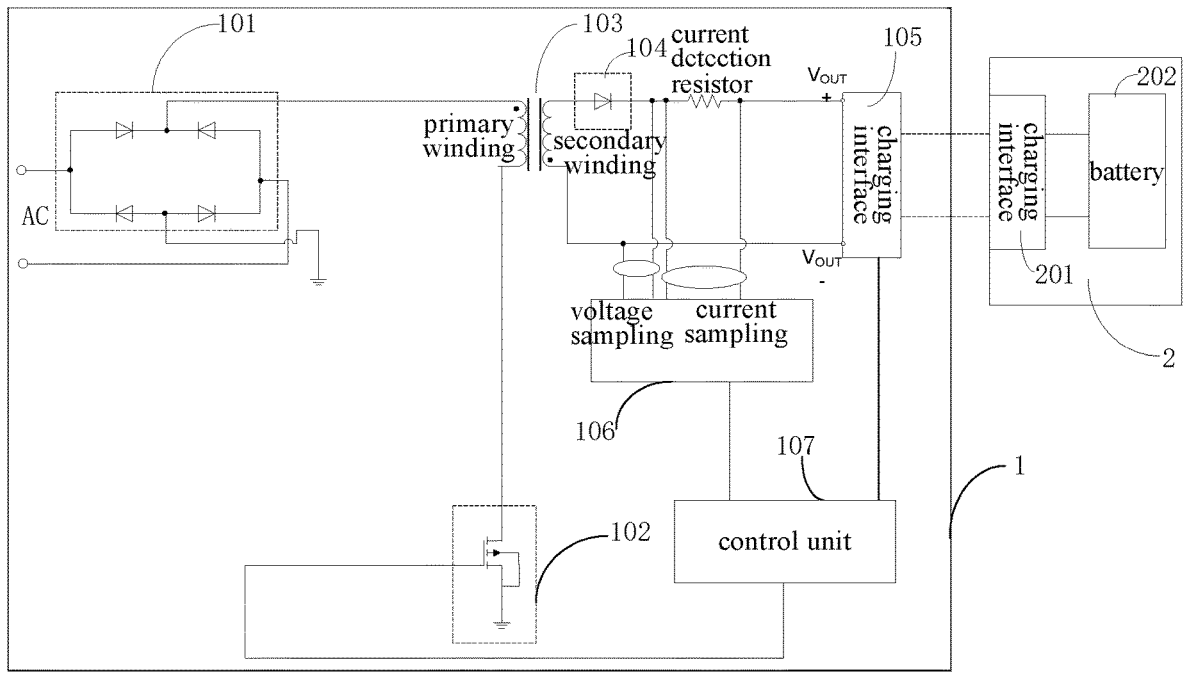
FIG. 1A is a schematic diagram illustrating a charging system using a flyback switching power supply according to an embodiment of the present disclosure.

Descriptions will be made in detail to embodiments of the present disclosure, examples of which are illustrated in drawings, in which the same or similar elements and the elements having same or similar functions are denoted by like reference numerals throughout the descriptions. The embodiments described herein with reference to drawings are explanatory, are intended to understand the present disclosure, and are not construed to limit the present disclosure.

The present disclosure is made based on the inventor's knowledge and research on the following issues.

The inventors find that, during a charging to a battery of a mobile terminal by a power adapter, as the power of the power adapter becomes larger, it is easy to increase polarization resistance of the battery and increase temperature of the battery, thus reducing a service life of the battery, and affecting a reliability and a safety of the battery.

Moreover, when powered with an alternating current, most devices cannot work directly with the alternating current, this is because the alternating current such as mains supply of 220V and 50 Hz outputs electric energy discontinuously. In order to avoid the discontinuity, it needs to use an electrolytic capacitor to store the electric energy, such that when the power supply is in the trough period, continuity of power supply relies on the electric energy stored in the electrolytic capacitor to maintain a stable power supply. Thus, when an alternating current power source charges the mobile terminal via the power adapter, the alternating current such as the alternating current of 220V provided by the alternating current power source is converted into a stable direct current, and the stable direct current is provided to the mobile terminal. However, the power adapter charges the battery in the mobile terminal so as to supply power to the mobile terminal indirectly, and the continuity of power supply can be guaranteed by the battery, such that it is unnecessary for the power adapter to output a stable direct current continuously when charging the battery.

Accordingly, a first objective of the present disclosure is to provide a charging system, which enables a voltage with a pulsating waveform outputted by a power adapter to be applied to a battery of the terminal directly, thus realizing miniaturization and low cost of the power adapter, and prolonging a service life of the battery. Further, a current sampling is performed by an operational amplifier with an adjustable amplification factor, such that both a detection precision and a dynamic range of the current detection can be ensured.

A second objective of the present disclosure is to provide a device. A third objective of the present disclosure is to provide a charging method.

Before describing charging system, a device and a charging method according to embodiments of the present disclosure, a device, such as a power adapter (hereinafter, "related adapter") a power bank or the like, for charging the device to be charged such as a terminal in the related art will be described.

Voltage outputted by the related adapter is basically constant, such as 5V, 9V, 12V or 20V or the like, when the related adapter works in a constant voltage mode.

The voltage outputted by the related adapter is unsuitable for being directly applied to both ends of a battery. It is required to convert the voltage by a conversion circuit in the device to be charged (such as the terminal) to obtain a charging voltage and/or charging current expected by the battery in the device to be charged (such as the terminal).

The conversion circuit is configured to convert the voltage outputted by the related adapter, to meet a requirement of the charging voltage and/or charging current expected by the battery.

As an example, the conversion circuit may be a charging management module, such as a charging integrated circuit (IC) in the terminal. During a charging process of the battery, the conversion circuit may be configured to manage the charging voltage and/or charging current of the battery. The conversion circuit may have functionality of a voltage feedback module and/or functionality of a current feedback module, so as to manage the charging voltage and/or charging current of the battery.

For example, the charging process of the battery may include one or more of a trickle charging stage, a constant current charging stage and a constant voltage charging stage.

In the trickle charging stage, the conversion circuit may utilize a current feedback loop to ensure that a current flowing into the battery in the trickle charging stage meets the charging current (such as a first charging current) expected by the battery. In the constant current charging stage, the conversion circuit may utilize a current feedback loop to ensure that the current flowing into the battery in the constant current charging stage meets the charging current (such as a second charging current, which may be greater than the first charging current) expected by the battery. In the constant voltage charging stage, the conversion circuit may utilize a voltage feedback loop to ensure that a voltage applied to both ends of the battery in the constant voltage charging stage meets the charging voltage expected by the battery.

As an example, when the voltage outputted by the related adapter is greater than the charging voltage expected by the battery, the conversion circuit may be configured to perform a buck conversion on the voltage outputted by the related adapter to enable a buck-converted charging voltage to meet the requirement of the charging voltage expected by the battery. As another example, when the voltage outputted by the related adapter is less than the charging voltage expected by the battery, the conversion circuit may be configured to perform a boost conversion on the voltage outputted by the related adapter to enable a boost-converted charging voltage to meet the requirement of the charging voltage expected by the battery.

As another example, assume that the related adapter outputs a constant voltage of 5V. When the battery includes a single battery cell (such as a lithium battery cell, a charging cut-off voltage of a single battery cell is typically 4.2V), the conversion circuit (for example, a buck circuit) may perform a buck conversion on the voltage outputted by the related adapter, such that the charging voltage obtained after the buck conversion meets a requirement of the charging voltage expected by the battery.

As yet another example, assume that the related adapter outputs a constant voltage of 5V. When the related adapter charges a battery including two or more battery cells (such as lithium battery cell, a charging cut-off voltage of a single battery cell is typically 4.2V) coupled in series, the conversion circuit (for example, a boost circuit) may perform a boost conversion on the voltage outputted by the related adapter, such that the charging voltage obtained after the boost conversion meets a requirement of the charging voltage expected by the battery.

Limited by a poor conversion efficiency of the conversion circuit, unconverted electric energy is lost in a form of heat, and the heat may gather inside the device to be charged (such as the terminal). A design space and a space for heat dissipation of the device to be charged (such as the terminal) are small (for example, the physical size of a mobile terminal used by a user becomes thinner and thinner, while plenty of electronic elements are densely arranged in the mobile terminal to improve performance of the mobile terminal), which not only increases difficulty in designing the conversion circuit, but also results in that it is hard to dissipate the heat gathered in the device to be charged (such as the terminal) in time, thus further causing an abnormity of the device to be charged (such as the terminal).

For example, the heat gathered on the conversion circuit may cause a thermal interference on electronic elements neighboring the conversion circuit, thus causing abnormal operations of the electronic elements. For another example, the heat gathered on the conversion circuit may shorten the service life of the conversion circuit and neighboring electronic elements. For yet another example, the heat gathered on the conversion circuit may cause a thermal interference on the battery, thus causing abnormal charging and/or abnormal discharging of the battery. For still another example, the heat gathered on the conversion circuit may increase the temperature of the device to be charged (such as the terminal), thus affecting user experience during the charging. For still yet another example, the heat gathered on the conversion circuit may short-circuit the conversion circuit, such that the voltage outputted by the related adapter is directly applied to both ends of the battery, thus causing an abnormity in charging of the battery, which brings safety hazard if the over-voltage charging lasts for a long time, for example, the battery may explode.

The device according to embodiments of the present disclosure may obtain status information of the battery. The status information of the battery at least includes electric quantity information and/or voltage information of the battery. The device adjusts the voltage outputted by itself according to the obtained status information of the battery, to meet the requirement of the charging voltage and/or charging current expected by the battery. The output voltage after the adjustment may be directly applied to both ends of the battery for charging the battery. The voltage outputted by the device may be a voltage with a pulsating waveform.

The device may have functionality of the voltage feedback module and functionality of the current feedback module, so as to realize a government of the charging voltage and/or charging current of the battery.

In some embodiments, the device may adjust the voltage outputted by itself according to the obtained status information of the battery as follows. The device may obtain the status information of the battery in real time, and adjust the voltage outputted by itself according to the status information of the battery obtained in real time, to meet the charging voltage and/or charging current expected by the battery.

In some embodiments, the device may adjust the voltage outputted by itself according to the status information of the battery obtained in real time as follows. During the charging process, with the increasing of the charging voltage of the battery, the device may obtain status information of the battery at different time points in the charging process, and adjust the voltage outputted by itself in real time according to the status information of the battery at different time points in the charging process, to meet the requirement of the charging voltage and/or charging current expected by the battery. The output voltage after the adjustment of the device may be directly applied to both ends of the battery to charge the battery.

For example, the charging process of the battery may include at least one of a trickle charging stage, a constant current charging stage and a constant voltage charging stage. In the trickle charging stage, the device may output the first charging current (the first charging current may be a current with a pulsating waveform) to charge the battery, so as to meet the requirement of the charging current expected by the battery. In the constant current charging stage, the device may utilize a current feedback loop to ensure that the current outputted by the device and flowing into the battery in the constant current charging stage meets the requirement of the charging current expected by the battery (such as a second charging current, which may be a current with a pulsating waveform, and may be greater than the first charging current. For example, the second charging current being greater than the first charging current means that, a peak value of the current with the pulsating waveform in the constant current charging stage is greater than that of the current with the pulsating waveform in the trickle charging stage, while "constant current" of the constant current charging stage means that, in the constant current charging stage, a peak value or a mean value of the current with the pulsating waveform is basically constant). In the constant voltage charging stage, the device may utilize a voltage feedback loop to ensure that a voltage (i.e., a voltage with a pulsating waveform) outputted by the device to the device to be charged (such as the terminal) within the constant voltage charging stage is constant.

For example, the device according to embodiments of the present disclosure is mainly configured to control the constant current charging stage of the battery in the device to be charged (such as the terminal). In other embodiments, the control on the trickle charging stage and the constant voltage charging stage of the battery in the device to be charged (such as the terminal) can be realized by the device according to embodiments of the present disclosure in coordination with an additional charging chip in the device to be charged (such as the terminal). Compared to the constant current charging stage, the charging power received by the battery in the trickle charging stage and the constant voltage charging stage is smaller, such that the conversion loss and heat accumulation of the charging chip in the device to be charged (such as the terminal) is acceptable. In some embodiments, the constant current charging stage or the constant current stage involved in embodiments of the present disclosure may refer to a charging mode in which the current outputted by the device is controlled. It is unnecessary to keep the current outputted by the device completely constant. For example, the constant current may refer to that, a peak value or a mean value of the current with the pulsating waveform outputted by the device is basically constant, or keeps constant during a certain time period. For example, in practice, the device typically adopts a multi-stage constant current mode for charging in the constant current charging stage.

The multi-stage constant current charging may include N constant current stages, where N is an integer no less than 2. The first charging stage of the multi-stage constant current charging starts with a predetermined charging current. M constant current stages in the multi-stage constant current charging are performed in sequence from the first charging stage to the $(N-1)^{th}$ charging stage. After the constant current charging is switched from one constant current stage to the next constant current stage, the peak value or mean value of the current with the pulsating waveform may be decreased. When the battery voltage reaches a charging stop voltage threshold, the constant current charging is switched from the present constant current stage to the next constant current stage. The current change between two adjacent constant current stages may be gradual, or may be in a stepped skip manner.

Further, the terminal according to embodiments of the present disclosure includes, but is not limited to a device configured to receive/transmit communication signals via a wired connection (for example, public switched telephone network (PSTN), digital subscriber line (DSL) connection, digital cable connection, direct cable connection and/or another data connection/network) and/or via a wireless interface (for example, cellular network, wireless local area network (WLAN), digital TV network such as digital video broadcasting handheld (DVB-H) network, satellite network, an amplitude modulation-frequency modulation (AM-FM) broadcasting transmitter, and/or a wireless interface of another communication terminal). The communication terminal configured to communicate via the wireless interface may be referred to as "wireless communication terminal", "wireless terminal" and/or "mobile terminal". Examples of a mobile terminal include, but are not limited to a satellite phone or a cell phone, a terminal combining a cell radio phone and a personal communication system (PCS) having capability of data process, fax, and data communication, a personal digital assistant (PDA) including a radio phone, a pager, Internet/Intranet access, a web browser, a note pad & address book, a calendar and/or a global positioning system (GPS) receiver, and a common laptop and/or handheld receiver, or other electronic devices including a radio phone transceiver.

In addition, in embodiments of the present disclosure, when the voltage with the pulsating waveform outputted by the adapter is directly applied to both ends of the battery in the terminal to charge the battery, the charging current may be characterized by a pulsating waveform such as a steamed bun waveform. In some embodiments, the charging current may be used to charge the battery intermittently. A period of the charging current may vary with a frequency of an input alternating current (such as a frequency of an alternating current power grid). For example, the frequency corresponding to the period of the charging current may be an integral multiple or a fraction of the frequency of the power grid. Moreover, when the charging current is used to charge the battery intermittently, a current waveform corresponding to the charging current may be formed of one pulse or a set of pulses synchronous to the power grid.

In the following, a charging system, a device, and a charging method provided in embodiments of the present disclosure will be described with reference to drawings.

Referring to FIGS. 1A-14, the charging system may include a battery 202, a first rectifier 101, a switch unit 102, a transformer 103, a second rectifier 104, a first current sampling circuit 1061, and a control unit 107.

The first rectifier 101 is configured to rectify an input alternating current and output a first voltage with a first ripple waveform. The switch unit 102 is configured to modulate the first voltage according to a control signal. The transformer 103 is configured to output a second voltage with a second ripple waveform according to the modulated first voltage. The second rectifier 104 is configured to rectify the second voltage to output a third voltage with a third ripple waveform, and the third voltage is configured to be applied to a battery to charge the battery. The first current sampling circuit 1061 is configured to sample a current outputted by the second rectifier to obtain a current sampling value. The first current sampling circuit 1061 includes an operational amplifier with an adjustable amplification factor. The control unit 107 is coupled to the first current sampling circuit 1061 and the switch unit 102 respectively. The control unit 107 is configured to output the control signal to the switch unit 102, to adjust the amplification factor of the operational amplifier according to a charging mode, and to adjust a duty ratio of the control signal according to the current sampling value, such that the third voltage meets a charging requirement of the battery 202.

In at least one embodiment of the present disclosure, part or all structure (hardware and software) of the adapter can be integrated into the terminal. Integrated structure of the adapter and the terminal can be called as the charging system of the present disclosure, or called as a terminal.

In an embodiment of the present disclosure, the charging system provided in embodiments of the present disclosure includes a device 1 and a terminal 2. The battery 202 may be a component in a terminal 2. The first rectifier 101, the switch unit 102, the transformer 103, the second rectifier 104, the first current sampling circuit 1061 and the control unit 107 may be disposed in a device 1.

Figure 2A:
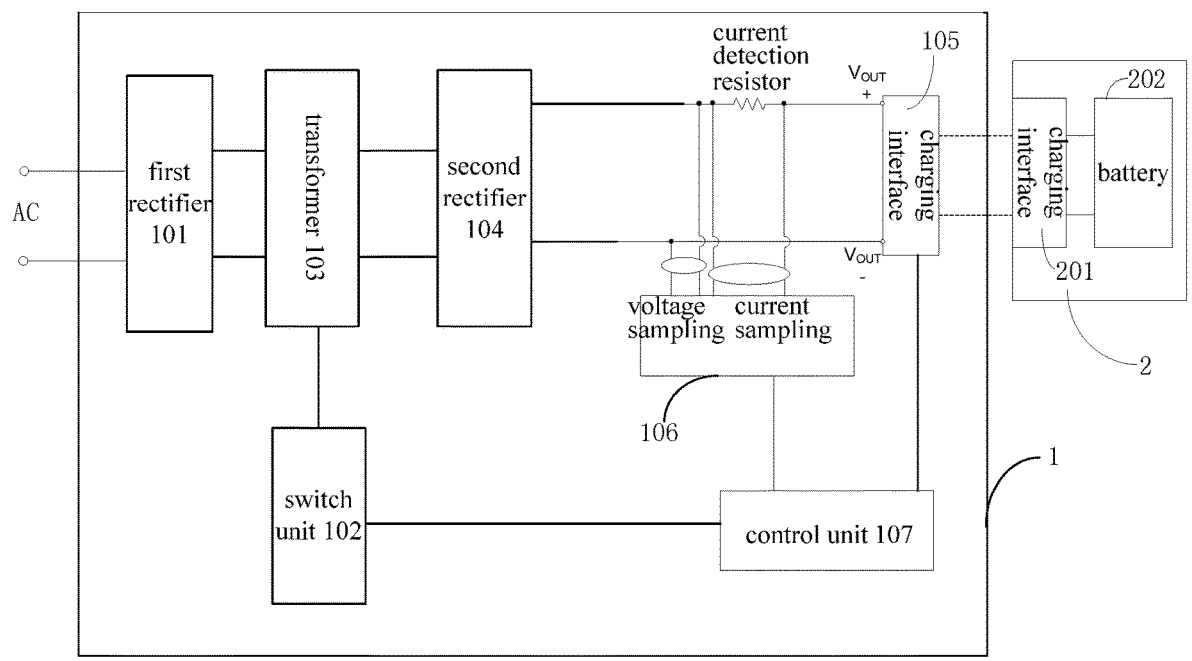
FIG. 2A is a block diagram of a charging system according to an embodiment of the present disclosure.
Figure 2B:
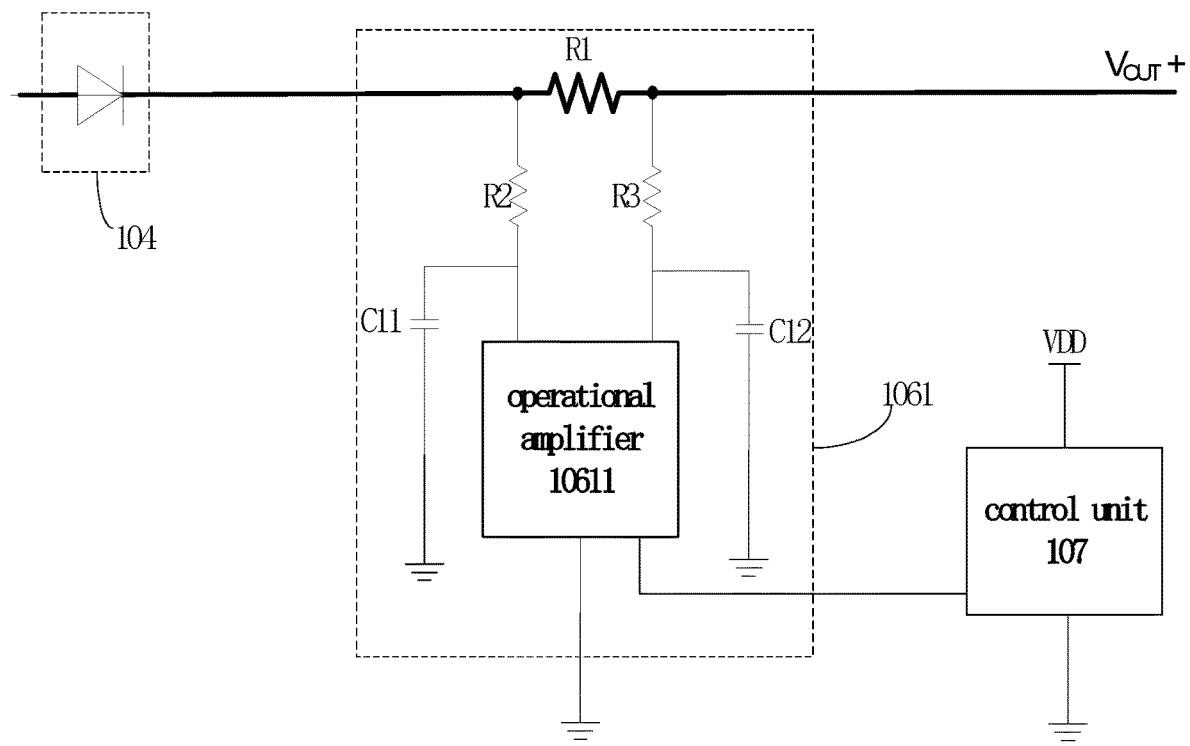
FIG. 2B is a block diagram of a first current sampling circuit according to an embodiment of the present disclosure.

As illustrated in FIG. 2A and FIG. 2B, the device 1 includes a first rectifier 101, a switch unit 102, a transformer 103, a second rectifier 104, a first current sampling circuit 1061, and a control unit 107. The first rectifier 101 is configured to rectify an input alternating current (mains supply, for example AC of 220V) to output a first voltage with a first pulsating waveform, for example a voltage with a steamed bun waveform. As illustrated in FIG. 1A, the first rectifier 101 may be a full-bridge rectifier circuit formed of four diodes. The switch unit 102 is configured to modulate the first voltage with the first pulsating waveform according to a control signal. The switch unit 102 may be formed of MOS transistors. A pulse width modulation (PWM) control is performed on the MOS transistors to perform a chopping modulation on the voltage with the steamed bun waveform. The transformer 103 is configured to output a second voltage with a second pulsating waveform according to the modulated first voltage. The second rectifier 104 is configured to rectify the second voltage with the second pulsating waveform and output a third voltage with a third pulsating waveform. The second rectifier 104 may be formed of diodes or MOS transistors, and can realize a secondary synchronous rectification, such that the third pulsating waveform keeps synchronous with a waveform of the modulated first voltage. In an embodiment, the third pulsating waveform keeping synchronous with the waveform of the modulated first voltage means that, a phase of the third pulsating waveform is consistent with that of the waveform of the modulated first voltage, and a variation trend of magnitude of the third pulsating waveform is consistent with that of the waveform of the modulated first voltage. The first current sampling circuit 1061 is configured to sample current outputted by the second rectifier 104 to obtain a current sampling value. The first current sampling circuit 1061 includes an operational amplifier 10611 with an adjustable amplification factor. The control unit 107 is coupled to the first current sampling circuit 1061 and the switch unit 102 respectively. The control unit 107 is configured to output the control signal to the switch unit 102, to adjust the amplification factor of the operational amplifier 10611 according to a charging mode so as to be suitable for different requirements for current detection, and to adjust a duty ratio of the control signal according to the current sampling value, such that the third voltage outputted by the second rectifier 104 meets a charging requirement of the terminal 2 when the device 1 is coupled to the terminal 2.

Further, in an embodiment of the present disclosure, the device further includes a first charging interface 105. The first charging interface 105 is coupled to an output end of the second rectifier 104, and configured to apply the third voltage to a battery in a terminal when the first charging interface is coupled to the terminal.

As illustrated in FIG. 2A, the terminal 2 includes a battery 202. The third voltage is configured to be applied to a battery in a terminal to charge the battery in the terminal when the device is coupled to the terminal.

In an embodiment, the terminal 2 further includes a second charging interface 201. The second charging interface 201 is coupled to the battery 202. When the second charging interface 201 is coupled to the first charging interface 105, the second charging interface 201 is configured to apply the third voltage with the third pulsating waveform to the battery 202, so as to charge the battery 202.

In an embodiment of the present disclosure, as illustrated in FIG. 1A, the device 1 may adopt a flyback switching power supply. In an embodiment, the transformer 103 may include a primary winding and a secondary winding. One end of the primary winding is coupled to a first output end of the first rectifier 101. A second output end of the first rectifier 101 is grounded. Another end of the primary winding is coupled to the switch unit 102 (for example, when the switch unit 102 is a MOS transistor, the other end of the primary winding is coupled to a drain of the MOS transistor). The transformer 103 is configured to output a second voltage with a second pulsating waveform according to the modulated first voltage.

The transformer 103 is a high-frequency transformer of which a working frequency ranges from 50 KHz to 2 MHz. The high-frequency transformer is configured to couple the modulated first voltage to the secondary side so as to output via the secondary winding. In embodiments of the present disclosure, with the high-frequency transformer, a characteristic of a small size compared to the low-frequency transformer (also known as an industrial frequency transformer, mainly used in the frequency of mains supply such as an alternating current of 50 Hz or 60 Hz) may be exploited to realize miniaturization of the device 1.

Figure 1B:
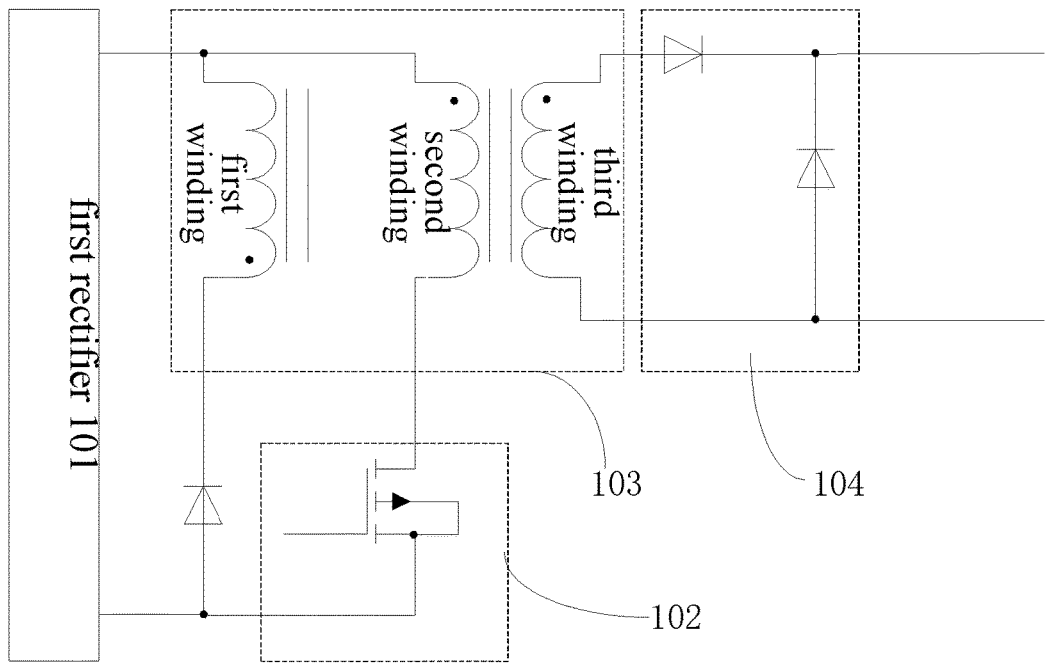
FIG. 1B is a schematic diagram illustrating a charging system using a forward switching power supply according to an embodiment of the present disclosure.

In an embodiment of the present disclosure, as illustrated in FIG. 1B, the device 1 may also adopt a forward switching power supply. In an embodiment, the transformer 103 includes a first winding, a second winding and a third winding. A dotted terminal of the first winding is coupled to a second output end of the first rectifier 101 via a backward diode. A non-dotted terminal of the first winding is coupled to a dotted terminal of the second winding and then coupled to a first output end of the first rectifier 101. A non-dotted terminal of the second winding is coupled to the switch unit 102. The third winding is coupled to the second rectifier 104. The backward diode is configured to realize reverse peak clipping. An induced potential generated by the first winding may perform amplitude limiting on a reverse potential via the backward diode and return limited energy to an output of the first rectifier 101, so as to charge the output of the first rectifier 101. Moreover, a magnetic field generated by current flowing through the first winding may demagnetize a core of the transformer, so that the magnetic field intensity in the core of the transformer returns to an initial state. The transformer 103 is configured to output the second voltage with the second pulsating waveform according to the modulated first voltage.

Figure 1C:
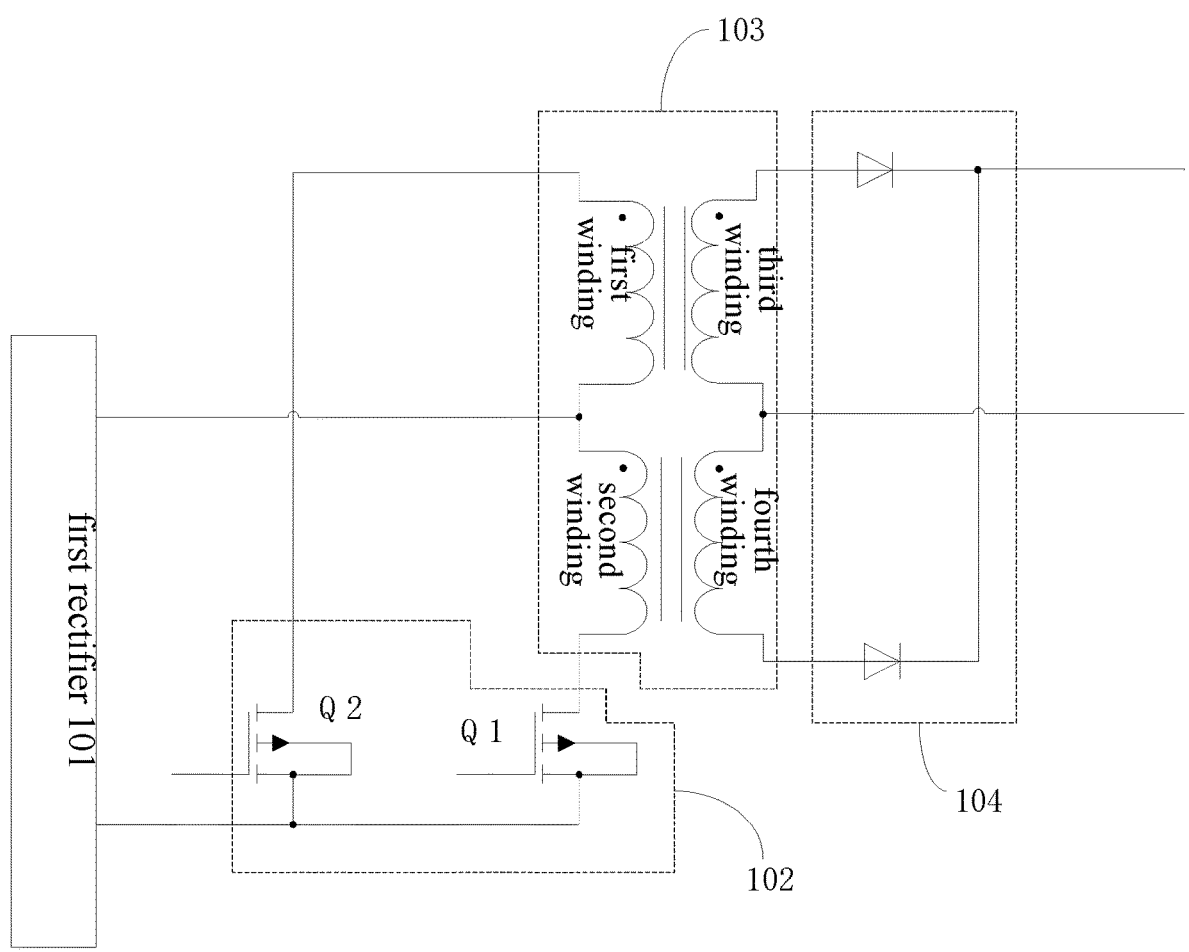
FIG. 1C is a schematic diagram illustrating a charging system using a push-pull switching power supply according to an embodiment of the present disclosure.

According to an embodiment of the present disclosure, as illustrated in FIG. 1C, the above-mentioned device 1 may adopt a push-pull switching power supply. In an embodiment, the transformer includes a first winding, a second winding, a third winding and a fourth winding. A dotted terminal of the first winding is coupled to the switch unit 102. A non-dotted terminal of the first winding is coupled to a dotted terminal of the second winding and then coupled to the first output end of the first rectifier 101. A non-dotted terminal of the second winding is coupled to the switch unit 102. A non-dotted terminal of the third winding is coupled to a dotted terminal of the fourth winding. The transformer is configured to output the second voltage with the second pulsating waveform according to the modulated first voltage.

As illustrated in FIG. 1C, the switch unit 102 includes a first MOS transistor Q1 and a second MOS transistor Q2. The transformer 103 includes a first winding, a second winding, a third winding and a fourth winding. A dotted terminal of the first winding is coupled to a drain of the first MOS transistor Q1 in the switch unit 102. A non-dotted terminal of the first winding is coupled to a dotted terminal of the second winding. A node between the non-dotted terminal of the first winding and the dotted terminal of the second winding is coupled to the first output end of the first rectifier 101. A non-dotted terminal of the second winding is coupled to a drain of the second MOS transistor Q2 in the switch unit 102. A source of the first MOS transistor Q1 is coupled to a source of the second MOS transistor Q2 and then coupled to the second output end of the first rectifier 101. A dotted terminal of the third winding is coupled to a first input end of the second rectifier 104. A non-dotted terminal of the third winding is coupled to a dotted terminal of the fourth winding. A node between the non-dotted terminal of the third winding and the dotted terminal of the fourth winding is grounded. A non-dotted terminal of the fourth winding is coupled to a second input end of the second rectifier 104.

As illustrated in FIG. 1C, the first input end of the second rectifier 104 is coupled to the dotted terminal of the third winding, and the second input end of the second rectifier 104 is coupled to the non-dotted terminal of the fourth winding. The second rectifier 104 is configured to rectify the second voltage with the second pulsating waveform to output the third voltage with the third pulsating waveform. The second rectifier 104 may include two diodes. An anode of one diode is coupled to the dotted terminal of the third winding. An anode of another diode is coupled to a non-dotted terminal of the fourth winding. A cathode of one diode is coupled to that of the other diode.

Figure 1D:
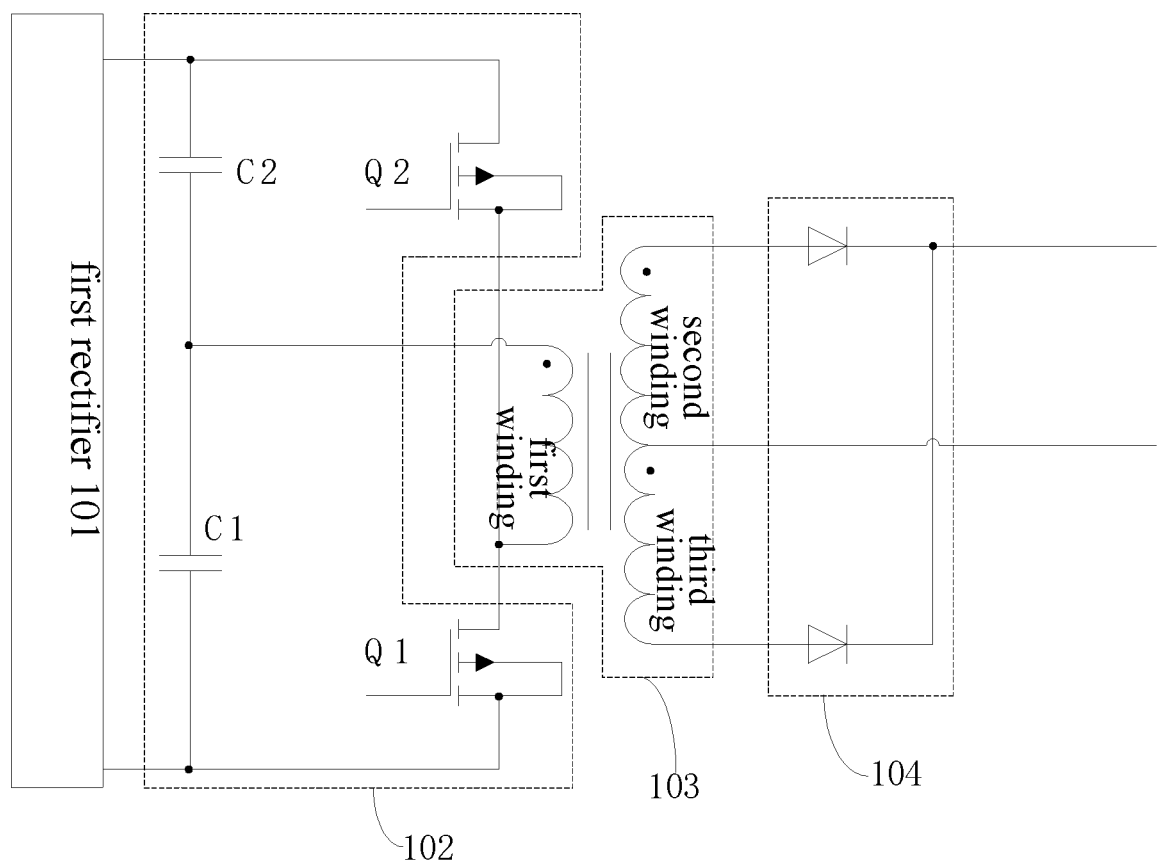
FIG. 1D is a schematic diagram illustrating a charging system using a half-bridge switching power supply according to an embodiment of the present disclosure.

According to an embodiment of the present disclosure, as illustrated in FIG. 1D, the above-mentioned device 1 may also adopt a half-bridge switching power supply. In an embodiment, the switch unit 102 includes a first MOS transistor Q1, a second MOS transistor Q2, a first capacitor C1 and a second capacitor C2. The first capacitor C1 and the second capacitor C2 are coupled in series, and then coupled in parallel to the output ends of the first rectifier 101. The first MOS transistor Q1 and the second MOS transistor Q2 are coupled in series, and then coupled in parallel to the output ends of the first rectifier 101. The transformer 103 includes a first winding, a second winding and a third winding. A dotted terminal of the first winding is coupled to a node between the first capacitor C1 and the second capacitor C2 coupled in series. A non-dotted terminal of the first winding is coupled to a node between the first MOS transistor Q1 and the second MOS transistor Q2 coupled in series. A dotted terminal of the second winding is coupled to the first input end of the second rectifier 104. A non-dotted terminal of the second winding is coupled to a dotted terminal of the third winding, and then grounded. A non-dotted terminal of the third winding is coupled to the second input end of the second rectifier 104. The transformer 103 is configured to output the second voltage with the second pulsating waveform according to the modulated first voltage.

Figure 1E:
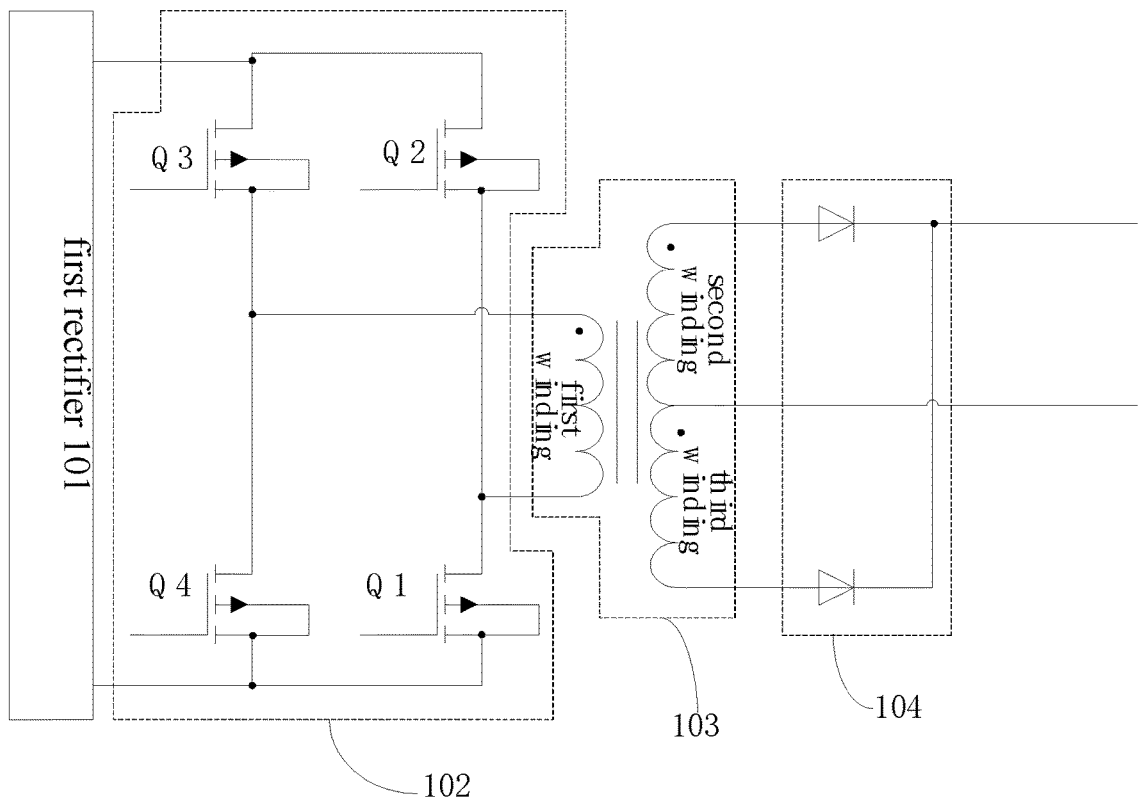
FIG. 1E is a schematic diagram illustrating a charging system using a full-bridge switching power supply according to an embodiment of the present disclosure.

According to an embodiment of the present disclosure, as illustrated in FIG. 1E, the above-mentioned device 1 may also adopt a full-bridge switching power supply. In an embodiment, the switch unit 102 includes a first MOS transistor Q1, a second MOS transistor Q2, a third MOS transistor Q3 and a fourth MOS transistor Q4. The third MOS transistor Q3 and the fourth MOS transistor Q4 are coupled in series and then coupled in parallel to the output ends of the first rectifier 101. The first MOS transistor Q1 and the second MOS transistor Q2 are coupled in series and then coupled in parallel to the output ends of the first rectifier 101. The transformer 103 includes a first winding, a second winding and a third winding. A dotted terminal of the first winding is coupled to a node between the third MOS transistor Q3 and the fourth MOS transistor Q4 coupled in series. A non-dotted terminal of the first winding is coupled to a node between the first MOS transistor Q1 and the second MOS transistor Q2 coupled in series. A dotted terminal of the second winding is coupled to the first input end of the second rectifier 104. A non-dotted terminal of the second winding is coupled to a dotted terminal of the third winding, and then grounded. A non-dotted terminal of the third winding is coupled to the second input end of the second rectifier 104. The transformer 103 is configured to output the second voltage with the second pulsating waveform according to the modulated first voltage.

Therefore, in embodiments of the present disclosure, the above-mentioned device 1 may adopt any one of the flyback switching power supply, the forward switching power supply, the push-pull switching power supply, the half-bridge switching power supply and the full-bridge switching power supply to output the voltage with the pulsating waveform.

Further, in an embodiment of the present disclosure, as illustrated in FIG. 1A, the second rectifier 104 is coupled to a secondary winding of the transformer 103. The second rectifying unit 104 is configured to rectify the second voltage with the second pulsating waveform to output a third voltage with a third pulsating waveform. The second rectifier 104 may consist of diodes, and can realize a secondary synchronous rectification, such that the third pulsating waveform keeps synchronous with a waveform of the modulated first voltage. In an embodiment, the third pulsating waveform keeping synchronous with the waveform of the modulated first voltage means that, a phase of the third pulsating waveform is consistent with that of the waveform of the modulated first voltage, and a variation trend of magnitude of the third pulsating waveform is consistent with that of the waveform of the modulated first voltage. The first charging interface 105 is coupled to the second rectifier 104. The sampling unit 106 may include the first current sampling circuit 1061 and a first voltage sampling circuit 1062. The sampling unit 106 is configured to sample the voltage and/or current outputted by the second rectifier 104 to obtain a voltage sampling value and/or a current sampling value. The control unit 107 is coupled to the sampling unit 106 and the switch unit 102 respectively. The control unit 107 is configured to output the control signal to the switch unit 102, and to adjust a duty ratio of the control signal according to the current sampling value and/or the voltage sampling value, such that the third voltage outputted by the second rectifier 104 meets a charging requirement of the terminal 2.

As illustrated in FIG. 1A, the terminal 2 includes a second charging interface 201 and a battery 202. The second charging interface 201 is coupled to the battery 202. When the second charging interface 201 is coupled to the first charging interface 105, the second charging interface 201 applies the third voltage with the third pulsating waveform to the battery 202 to charge the battery 202.

Figure 3:
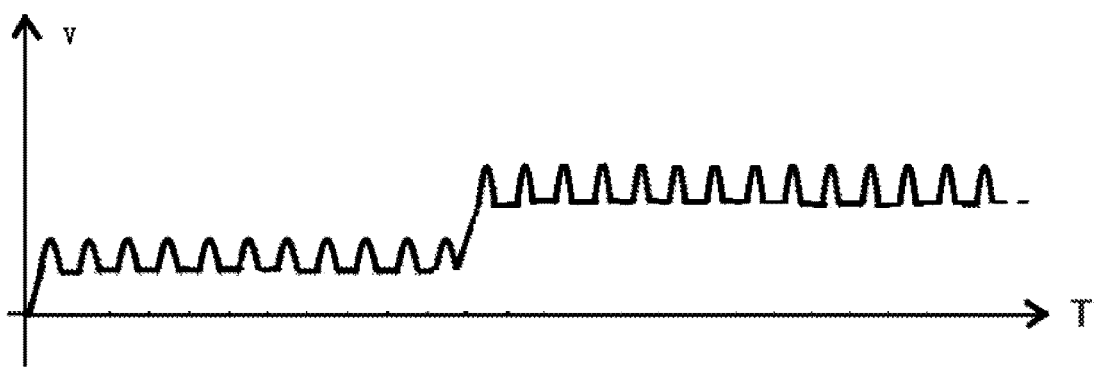
FIG. 3 is a schematic diagram illustrating a waveform of a charging voltage outputted to a battery from a device according to an embodiment of the present disclosure.
Figure 4:
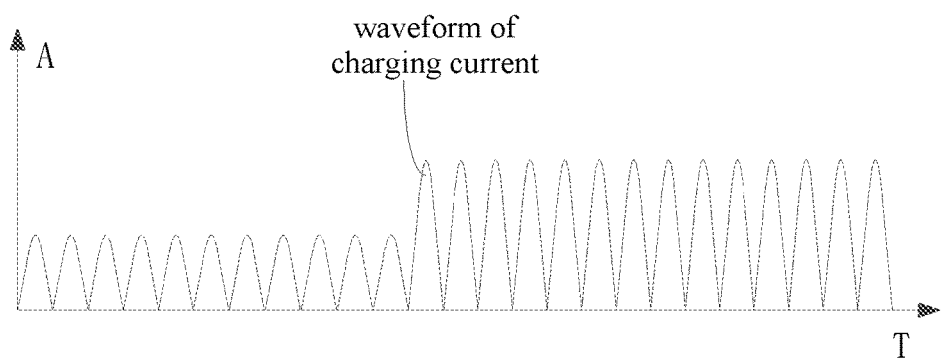
FIG. 4 is a schematic diagram illustrating a waveform of a charging current outputted to a battery from a device according to an embodiment of the present disclosure.

In an embodiment, the third voltage with the third pulsating waveform meeting the charging requirement means that, the third voltage and current with the third pulsating waveform need to meet the charging voltage and charging current when the battery is charged. In other words, the control unit 107 is configured to adjust the duty ratio of the control signal (such as a PWM signal) according to the sampled voltage and/or current outputted by the device, so as to adjust the output of the second rectifier 104 in real time and realize a closed-loop adjusting control, such that the third voltage with the third pulsating waveform meets the charging requirement of the terminal 2, thus ensuring the stable and safe charging of the battery 202. In an embodiment, a waveform of a charging voltage outputted to a battery 202 is illustrated in FIG. 3, in which the waveform of the charging voltage is adjusted according to the duty ratio of the PWM signal. A waveform of a charging current outputted to a battery 202 is illustrated in FIG. 4, in which the waveform of the charging current is adjusted according to the duty ratio of the PWM signal.

It can be understood that, when adjusting the duty ratio of the PWM signal, an adjusting instruction may be generated according to the voltage sampling value, or according to the current sampling value, or according to the voltage sampling value and the current sampling value.

Therefore, in embodiments of the present disclosure, by controlling the switch unit 102, a PWM chopping modulation is directly performed on the first voltage with the first pulsating waveform i.e. the steamed bun waveform after a rectification, and then a modulated voltage is sent to the high-frequency transformer and is coupled from the primary side to the secondary side via the high-frequency transformer, and then restore to the voltage/current with the steamed bun waveform after a synchronous rectification. The voltage/current with the steamed bun waveform is directly transmitted to the battery so as to realize fast charging to the battery. The magnitude of the voltage with the steamed bun waveform may be adjusted according to the duty ratio of the PWM signal, such that the output of the device may meet the charging requirement of the battery. It can be seen, the device according to embodiments of the present disclosure, without providing electrolytic capacitors at the primary side and the secondary side, may directly charge the battery via the voltage with the steamed bun waveform, such that a size of the device may be reduced, thus realizing miniaturization of the device, and decreasing cost greatly.

In an embodiment of the present disclosure, the control unit 107 may be a micro controller unit (MCU), which means that the control unit 107 may be a micro processor integrated with a switch driving control function, a synchronous rectification function, a voltage/current adjusting control function.

According to an embodiment of the present disclosure, the control unit 107 is further configured to adjust a frequency of the control signal according to the voltage sampling value and/or the current sampling value. That is, the PWM signal outputted to the switch unit 102 can be controlled by the control unit 107 to continuously output for a time period, and then the output of the PWM signal is stopped for a predetermined time period and then restarted. In this way, the voltage applied to the battery is intermittent, thus realizing the intermittent charging of the battery, which avoids a safety hazard caused by heating phenomenon occurring when the battery is charged continuously and improves the reliability and safety of the charging of the battery.

For lithium batteries, under a low temperature condition, since the conductivity of ions and electrons of the lithium battery decreases, it is prone to intensify degree of polarization during a charging process for the lithium battery. A continuous charging not only makes this polarization serious but also increases a possibility of lithium precipitation, thus affecting safety performance of the battery. Furthermore, the continuous charging may accumulate heat generated due to the charging, thus leading to a rising of internal temperature of the battery. When the temperature exceeds a certain value, performance of the battery may be limited, and possibility of safety hazard is increased.

In embodiments of the present disclosure, by adjusting the frequency of the control signal, the device outputs intermittently, which means that a battery resting process is introduced into the charging process, such that the lithium precipitation due to the polarization during the continuous charging is reduced and continuous accumulation of generated heat may be avoided to realize drop in the temperature, thus ensuring the safety and reliability of charging of the battery.

Figure 5:
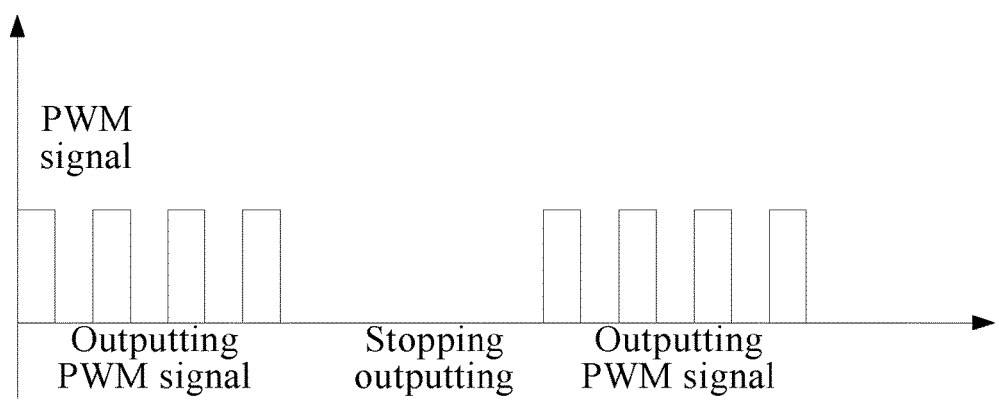
FIG. 5 is a schematic diagram illustrating a control signal outputted to a switch unit according to an embodiment of the present disclosure.

The control signal outputted to the switch unit 102 is illustrated in FIG. 5, for example. The PWM signal is continuously outputted for a time period, then output of the PWM signal is stopped for a certain time period, and then the PWM signal is continuously outputted for a time period again. In this way, the control signal output to the switch unit 102 is intermittent, and the frequency is adjustable.

As illustrated in FIG. 1A, the control unit 107 is coupled to the first charging interface 105. The control unit 107 is further configured to obtain status information of the terminal 2 by performing a communication with the terminal 2 via the first charging interface 105. In this way, the control unit 107 is further configured to adjust the duty ratio of the control signal (such as the PWM signal) according to the status information of the terminal, the voltage sampling value and/or the current sampling value.

The status information of the terminal may include an electric quantity of the battery, a temperature of the battery, a voltage of the battery, interface information of the terminal and information on path impedance of the terminal.

In an embodiment, the first charging interface 105 includes a power wire and a data wire. The power wire is configured to charge the battery. The data wire is configured to communicate with the terminal. When the second charging interface 201 is coupled to the first charging interface 105, communication query instructions may be transmitted by the device 1 and the terminal 2 to each other. A communication connection can be established between the device 1 and the terminal 2 after receiving a corresponding reply instruction. The control unit 107 may obtain the status information of the terminal 2, so as to negotiate with the terminal 2 about a charging mode and charging parameters (such as the charging current, the charging voltage) and to control the charging process.

The charging mode supported by the device and/or the terminal may include a first charging mode and a second charging mode. A charging speed of the first charging mode is faster than that of the second charging mode. For example, a charging current of the first charging mode is greater than that of the second charging mode. In general, the second charging mode may be understood as a charging mode in which a rated output voltage is 5V and a rated output current is less than or equal to 2.5 A. In addition, in the second charging mode, D+ and D− in the data wire of an output port of the device may be short-circuited. On the contrary, in the first charging mode according to embodiments of the present disclosure, the device may communicate with the terminal via D+ and D− wire in the data wire to realize data exchange, i.e., fast charging instructions may be sent by the device and the terminal to each other. The device sends a fast charging query instruction to the terminal. After receiving a fast charging reply instruction from the terminal, the device obtains the status information of the terminal and starts the first charging mode according to the fast charging reply instruction. The charging current in the first charging mode may be greater than 2.5 A, for example, may be 4.5 A or more. The second charging mode is not limited in embodiments of the present disclosure. As long as the device supports two charging modes one of which has a charging speed (or current) greater than the other charging mode, the charging mode with a slower charging speed may be regarded as the second charging mode. As to the charging power, the charging power in the first charging mode may be greater than or equal to 15 W.

The control unit 107 communicates with the terminal 2 via the first charging interface 105 to determine the charging mode. The charging mode includes the first charging mode and the second charging mode.

The first charging mode is a normal charging mode and the second charging mode is a fast charging mode. Under the normal charging mode, the device outputs a relatively small current (typically less than 2.5 A) or charges the battery in the mobile terminal with a relatively small power (typically less than 15 W). While, under the fast charge mode, the device outputs a relatively large current (typically greater than 2.5 A, such as 4.5 A, 5 A or higher) or charges the battery in the mobile terminal with a relatively large power (typically greater than or equal to 15 W), compared to the normal charging mode. In the normal charging mode, it may take several hours to fully fill a larger capacity battery (such as a battery with 3000 mAh), while in the fast charging mode, the period of time may be significantly shortened when the larger capacity battery is fully filled, and the charging is faster.

In an embodiment, the device is coupled to the terminal via a universal serial bus (USB) interface. The USB interface may be a general USB interface, a micro USB interface, or a USB interface in other types. A data wire in the USB interface is configured as the data wire in the first charging interface, and configured for a bidirectional communication between the device and the terminal. The data wire may be the D+ and/or D− wire in the USB interface. The bidirectional communication may refer to an information interaction performed between the device and the terminal.

The device performs the bidirectional communication with the terminal via the data wire in the USB interface, so as to determine to charge the terminal in the first charging mode.

In an embodiment, during a process that the device negotiates with the terminal whether to charge the terminal in the first charging mode, the device may only keep a coupling with the terminal but does not charge the terminal, or charges the terminal in the second charging mode or charges the terminal with a small current, which is not limited herein.

The device adjusts a charging current to a charging current in the first charging mode, and charges the terminal. After determining to charge the terminal in the first charging mode, the device may directly adjust the charging current to the charging current in the first charging mode or may negotiate with the terminal about the charging current of the first charging mode. For example, the charging current in the first charging mode may be determined according to a current electric quantity of the battery of the terminal.

In embodiments of the present disclosure, the device does not increase the output current blindly for fast charging, but needs to perform the bidirectional communication with the terminal so as to negotiate whether to adopt the first charging mode. Compared with the related art, the safety of fast charging is improved.

As an embodiment, the control unit 107 is configured to send a first instruction to the terminal when performing the bidirectional communication with the terminal via the first charging interface so as to determine to charge the terminal in the first charging mode. The first instruction is configured to query the terminal whether to operate in the first charging mode. The control unit 107 is configured to receive a reply instruction of the first instruction from the terminal. The reply instruction of the first instruction is configured to indicate that the terminal agrees to operate in the first charging mode.

As an embodiment, before the control unit sends the first instruction to the terminal, the device is configured to charge the terminal in the second charging mode. The control unit is configured to send the first instruction to the terminal when determining that a charging duration of the second charging mode is greater than a predetermined threshold.

In an embodiment, when the device determines that the charging duration of the second charging mode is greater than the predetermined threshold, the device may determine that the terminal has identified it as a power device, and the fast charging query communication may start.

As an embodiment, after determining to charge the terminal for a predetermined time period with a charging current greater than or equal to a predetermined current threshold, the device is configured to send the first instruction to the terminal.

As an embodiment, the control unit is further configured to control the device to adjust a charging current to a charging current in the first charging mode by controlling the switch unit. Before the device charges the terminal with the charging current in the first charging mode, the control unit is configured to perform the bidirectional communication with the terminal via the data wire of the first charging interface to determine a charging voltage in the first charging mode, and to control the device to adjust a charging voltage to the charging voltage in the first charging mode.

As an embodiment, when the control unit performs the bidirectional communication with the terminal via the data wire of the first charging interface to determine the charging voltage in the first charging mode, the control unit is configured to send a second instruction to the terminal, to receive a reply instruction of the second instruction sent from the terminal, and to determine the charging voltage in the first charging mode according to the reply instruction of the second instruction. The second instruction is configured to query whether a current output voltage of the device is suitable as the charging voltage in the first charging mode. The reply instruction of the second instruction is configured to indicate that the current output voltage of the device is suitable as the charging voltage in the first charging mode, relatively high the or low for being used as the charging voltage in the first charging mode.

As an embodiment, before controlling the device to adjust the charging current to the charging current in the first charging mode, the control unit is further configured to perform the bidirectional communication with the terminal via the data wire of the first charging interface to determine the charging current in the first charging mode.

As an embodiment, when performing the bidirectional communication with the terminal via the data wire of the first charging interface to determine the charging current in the first charging mode, the control unit is configured to send a third instruction to the terminal, to receive a reply instruction of the third instruction sent from the terminal and to determine the charging current in the first charging mode according to the reply instruction of the third instruction. The third instruction is configured to query a maximum charging current currently supported by the terminal. The reply instruction of the third instruction is configured to indicate the maximum charging current currently supported by the terminal.

The device may determine the above maximum charging current as the charging current in the first charging mode, or may set the charging current as a charging current less than the maximum charging current.

As an embodiment, during a process that the device charges the terminal in the first charging mode, the control unit is further configured to perform the bidirectional communication with the terminal via the data wire of the first charging interface, so as to continuously adjust a charging current outputted to the battery from the device by controlling the switch unit.

The device may query the status information of the terminal continuously, for example, query the voltage of the battery of the terminal, the electric quantity of the battery, etc., so as to continuously adjust the charging current outputted from the device to the battery.

As an embodiment, when the control unit performs the bidirectional communication with the terminal via the data wire of the first charging interface to continuously adjust the charging current outputted to the battery from the device by controlling the switch unit, the control unit is configured to send a fourth instruction to the terminal, to receive a reply instruction of the fourth instruction sent by the terminal in which the fourth instruction is configured to query a current voltage of the battery in the terminal, and to adjust the charging current outputted from the device to the battery by controlling the switch unit according to the current voltage of the battery. The reply instruction of the fourth instruction is configured to indicate the current voltage of the battery in the terminal.

As an embodiment, the control unit is configured to adjust the charging current outputted to the battery from the device to a charging current value corresponding to the current voltage of the battery by controlling the switch unit according to the current voltage of the battery and a predetermined correspondence between battery voltage values and charging current values.

In an embodiment, the device may store the correspondence between battery voltage values and charging current values in advance. The device may also perform the bidirectional communication with the terminal via the data wire of the first charging interface to obtain from the terminal the correspondence between battery voltage values and charging current values stored in the terminal.

As an embodiment, during the process that the device charges the terminal in the first charging mode, the control unit is further configured to perform the bidirectional communication with the terminal via the data wire of the first charging interface to determine whether the first charging interface and the second charging interface are in poor contact. When determining that the first charging interface and the second charging interface are in poor contact, the control unit is configured to control the device to quit the first charging mode.

As an embodiment, before determining whether the first charging interface and the second charging interface are in poor contact, the control unit is further configured to receive from the terminal information indicating path impedance of the terminal. The control unit is configured to send a fourth instruction to the terminal. The fourth instruction is configured to query a current voltage of the battery in the terminal. The control unit is configured to receive a reply instruction of the fourth instruction sent by the terminal. The reply instruction of the fourth instruction is configured to indicate the voltage of the battery in the terminal. The control unit is configured to determine path impedance from the device to the battery according to an output voltage of the device and the voltage of the battery. The control unit is configured to determine whether the first charging interface and the second charging interface are in poor contact according to the path impedance from the device to the battery, the path impedance of the terminal, and path impedance of a charging circuit between the device and the terminal.

The terminal may record the path impedance thereof in advance. For example, since the terminals in the same type have the same structure, the path impedance of terminals in the same type is set to the same value when configuring factory settings. Similarly, the device may record the path impedance of the charging circuit in advance. When the device obtains the voltage cross both ends of the battery of the terminal, the path impedance of the whole path can be determined according to the voltage drop cross two ends of the battery and the current of the path. When the path impedance of the whole path >the path impedance of the terminal+the path impedance of the charging circuit, or the path impedance of the whole path−(the path impedance of the terminal+the path impedance of the charging circuit)>an impedance threshold, it can be considered that the first charging interface and the second charging interface are in poor contact.

As an embodiment, before the device quits the first charging mode, the control unit is further configured to send a fifth instruction to the terminal. The fifth instruction is configured to indicate that the first charging interface and the second charging interface are in poor contact.

After sending the fifth instruction, the device may quit the first charging mode or reset.

The fast charging process according to embodiments of the present disclosure has been described from the perspective of the device; hereinafter, the fast charging process according to embodiments of the present disclosure will be described from the perspective of the terminal in the following.

In an embodiment, the interaction between the device and the terminal, relative characteristics, and functions described at the terminal side correspond to descriptions at the device side, thus repetitive description will be omitted for simplification.

Figure 13:
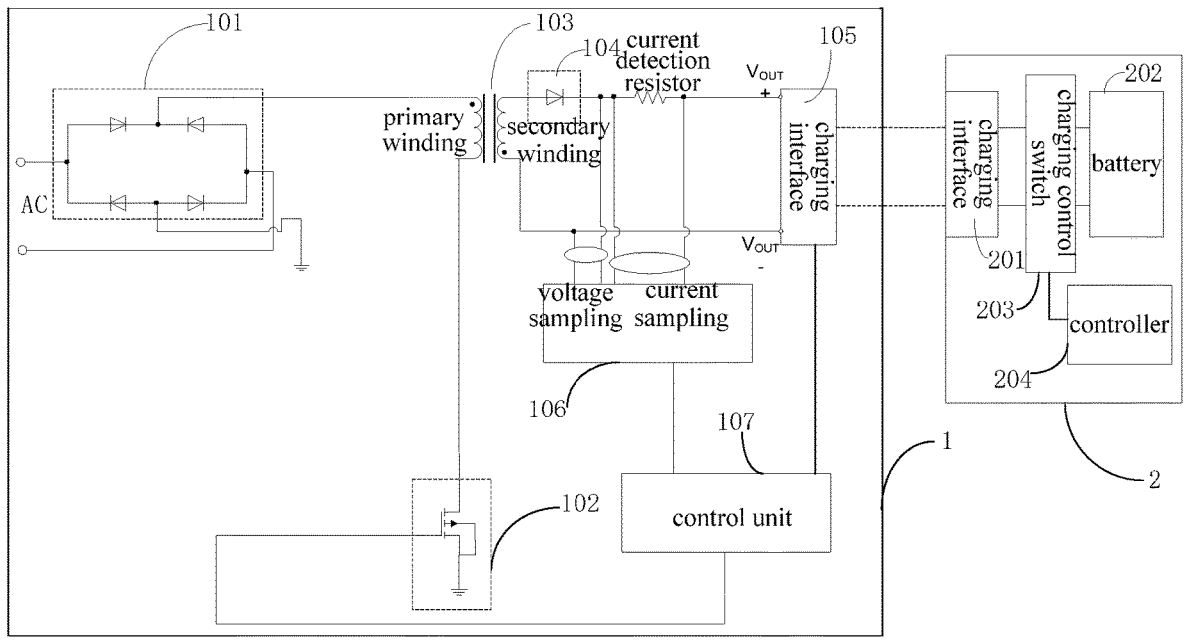
FIG. 13 is a schematic diagram of a terminal according to an embodiment of the present disclosure.

According to an embodiment of the present disclosure, as illustrated in FIG. 13, the terminal 2 further includes a charging control switch 203 and a controller 204. The charging control switch 203, such as a switch circuit formed of an electronic switch element, is coupled between the second charging interface 201 and the battery 202. The charging control switch 203 is configured to switch on or switch off a charging process of the battery 202 under control of the controller 204. In this way, the charging process of the battery 202 can be controlled at the terminal side, thus ensuring the safety and reliability of the charging of battery 202.

Figure 14:
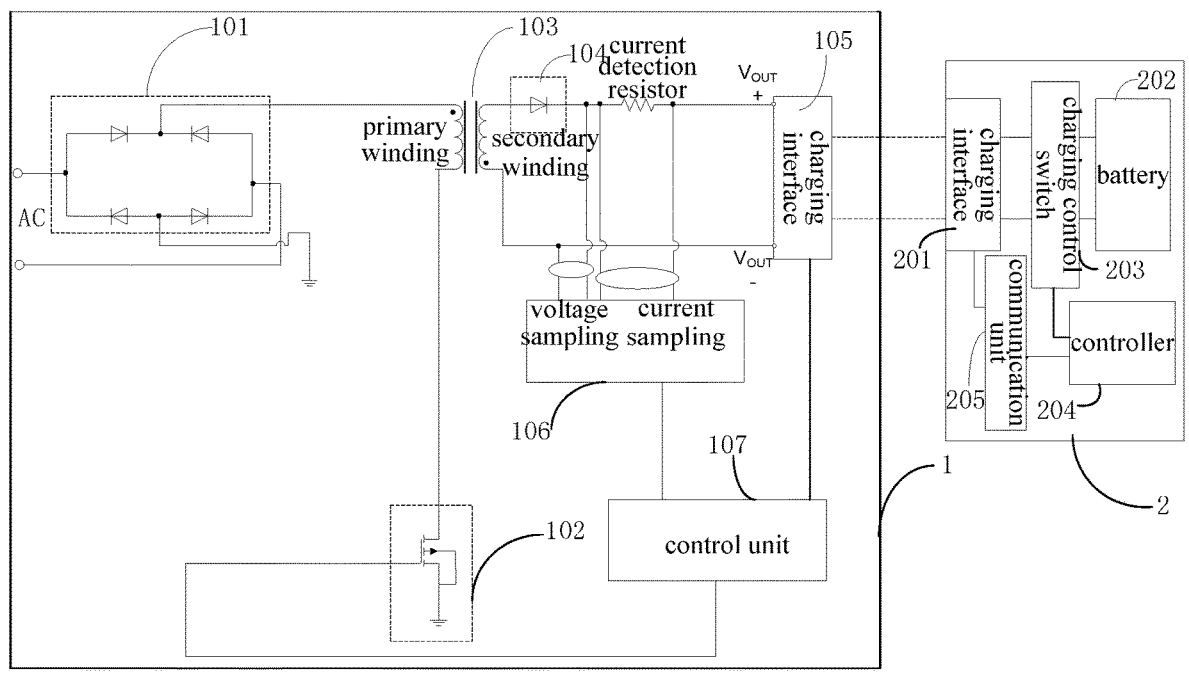
FIG. 14 is a schematic diagram of a terminal according to another embodiment of the present disclosure.

As illustrated in FIG. 14, the terminal 2 further includes a communication unit 205. The communication unit 205 is configured to establish a bidirectional communication between the controller 204 and the control unit 107 via the second charging interface 201 and the first charging interface 105. In other words, the terminal 2 and the device 1 can perform the bidirectional communication via the data wire in the USB interface. The terminal 2 supports the first charging mode and the second charging mode. The charging current of the first charging mode is greater than that of the second charging mode. The communication unit 205 performs the bidirectional communication with the control unit 107 such that the device 1 determines to charge the terminal 2 in the first charging mode, and the control unit 107 controls the device 1 to output according to the charging current in the first charging mode, to charge the battery 202 in the terminal 2.

In embodiments of the present disclosure, the device 1 does not increase the output current blindly for the fast charging, but needs to perform the bidirectional communication with the terminal to negotiate whether to adopt the first charging mode. Compared with the related art, the safety of the fast charging process is improved.

As an embodiment, the controller is configured to receive the first instruction sent by the control unit via the communication unit. The first instruction is configured to query the terminal whether to start the first charging mode. The controller is configured to send a reply instruction of the first instruction to the control unit via the communication unit. The reply instruction of the first instruction is configured to indicate that the terminal agrees to start the first charging mode.

As an embodiment, before the controller receives the first instruction sent by the control unit via the communication unit, the battery in the terminal is charged by the device in the second charging mode. When the control unit determines that a charging duration of the second charging mode is greater than a predetermined threshold, the control unit sends the first instruction to the communication unit in the terminal, and the controller receives the first instruction sent by the control unit via the communication unit.

As an embodiment, before the device outputs according to the charging current in the first charging mode to charge the battery in the terminal, the controller is configured to perform the bidirectional communication with the control unit via the communication unit, such that the device determines the charging voltage in the first charging mode.

As an embodiment, the controller is configured to receive a second instruction sent by the control unit, and to send a reply instruction of the second instruction to the control unit. The second instruction is configured to query whether a current output voltage of the device is suitable as the charging voltage in the first charging mode. The reply instruction of the second instruction is configured to indicate that the current output voltage of the device is suitable, high or low.

As an embodiment, the controller is configured to perform the bidirectional communication with the control unit, such that the device determines the charging current in the first charging mode.

The controller is configured to receive a third instruction sent by the control unit, in which the third instruction is configured to query a maximum charging current currently supported by the terminal. The controller is configured to send a reply instruction of the third instruction to the control unit, in which the reply instruction of the third instruction is configured to indicate the maximum charging current currently supported by the terminal, such that the device determines the charging current in the first charging mode according to the maximum charging current.

As an embodiment, during a process that the device charges the terminal in the first charging mode, the controller is configured to perform the bidirectional communication with the control unit, such that the device continuously adjusts a charging current outputted to the battery from the device.

The controller is configured to receive a fourth instruction sent by the control unit, in which the fourth instruction is configured to query a current voltage of the battery in the terminal. The controller is configured to send a reply instruction of the fourth instruction to the control unit, in which the reply instruction of the fourth instruction is configured to indicate the current voltage of the battery in the terminal, such that the device continuously adjusts the charging current outputted to the battery from the device according to the current voltage of the battery.

As an embodiment, during the process that the device charges the terminal in the first charging mode, the controller is configured to perform the bidirectional communication with the control unit via the communication unit, such that the device determines whether the first charging interface and the second charging interface are in poor contact.

The controller receives a fourth instruction sent by the control unit. The fourth instruction is configured to query a current voltage of the battery in the terminal. The controller sends a reply instruction of the fourth instruction to the control unit, in which the reply instruction of the fourth instruction is configured to indicate the current voltage of the battery in the terminal, such that the control unit determines whether the first charging interface and the second charging interface are in poor contact according to an output voltage of the device and the current voltage of the battery.

As an embodiment, the controller is configured to receive a fifth instruction sent by the control unit. The fifth instruction is configured to indicate that the first charging interface and the second charging interface are in poor contact.

Figure 6:
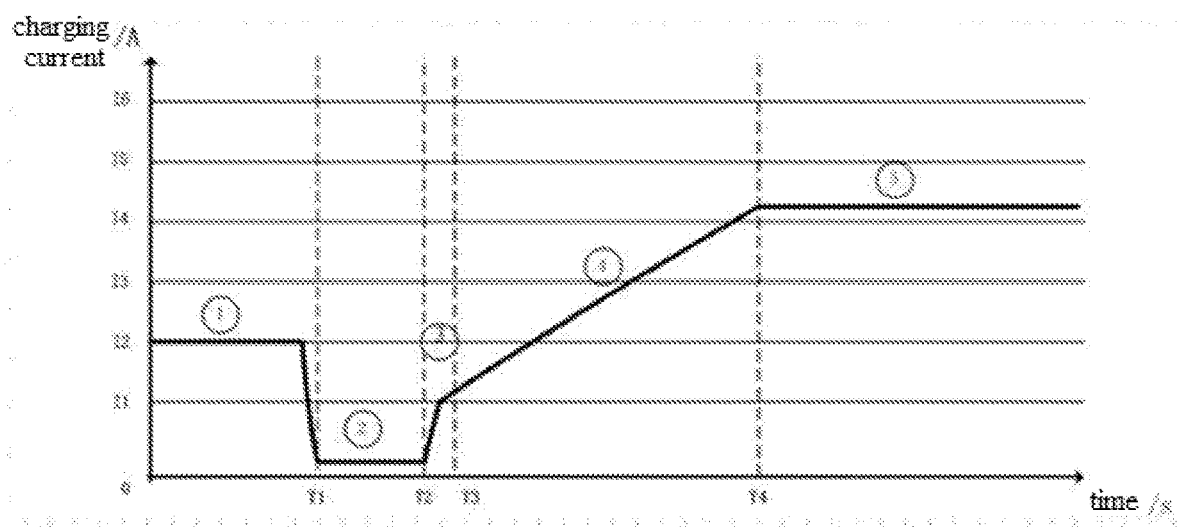
FIG. 6 is a schematic diagram illustrating a fast charging process according to an embodiment of the present disclosure.

In order to initiate and adopt the first charging mode, the device may perform a fast charging communication procedure with the terminal, and fast charging of a battery can be realized after one or more handshakes. Referring to FIG. 6, the fast charging communication procedure according to embodiments of the present disclosure and respective stages in the fast charging process will be described in detail. In an embodiment, communication actions or operations illustrated in FIG. 6 are merely exemplary. Other operations or various modifications of respective operations in FIG. 6 can be implemented in embodiments of the present disclosure. In addition, respective stages in FIG. 6 may be executed in an order different from that illustrated in FIG. 6, and it is unnecessary to execute all the operations illustrated in FIG. 6. A curve in FIG. 6 represents a variation trend of a peak value or a mean value of the charging current, rather than a curve of an actual charging current.

As illustrated in FIG. 6, the fast charging process may include the following five stages.

Stage 1:

After being coupled to a power supply providing device, the terminal may detect the type of the power supply providing device via the data wire D+ and D−. When detecting that the power supply providing device is a device, the terminal may absorb current greater than a predetermined current threshold I2, such as 1 A. When the device detects that the current outputted by the device is greater than or equal to I2 within a predetermined time period (such as a continuous time period T1), the device determines that the terminal has completed the recognition of the type of the power supply providing device. The device initiates a handshake communication between the device and the terminal, and sends an instruction 1 (corresponding to the above-mentioned first instruction) to query the terminal whether to operate in the first charging mode (or flash charging).

When receiving a reply instruction indicating that the terminal disagrees to operate in the first charging mode from the terminal, the device detects the output current of the device again. When the output current of the device is still greater than or equal to I2 within a predetermined continuous time period (such as a continuous time period T1), the device initiates a request again to query the terminal whether to operate in the first charging model. The above actions in stage 1 are repeated, until the terminal replies that it agrees to operate in the first charging mode or the output current of the device is no longer greater than or equal to I2.

After the terminal agrees to operate in the first charging mode, the fast charging process is initiated, and the fast charging communication procedure goes into stage 2.

Stage 2:

For the voltage with the steamed bun waveform outputted by the device, there may be several levels. The device sends an instruction 2 (corresponding to the above-mentioned second instruction) to the terminal to query the terminal whether the output voltage of the device matches to the current voltage of the battery (or whether the output voltage of the device is suitable, i.e., suitable as the charging voltage in the first charging mode), i.e., whether the output voltage of the device meets the charging requirement.

The terminal replies that the output voltage of the device is higher, lower or suitable. When the device receives a feedback indicating that the output voltage of the device is lower or higher from the terminal, the control unit adjusts the output voltage of the device by one level by adjusting the duty ratio of the PWM signal, and sends the instruction 2 to the terminal again to query the terminal whether the output voltage of the device matches.

The above actions in stage 2 are repeated, until the terminal replies to the device that the output voltage of the device is at a matching level. And then the fast charging communication procedure goes into stage 3.

Stage 3:

After the device receives from the terminal the feedback indicating that the output voltage of the device matches, the device sends an instruction 3 (corresponding to the above-mentioned third instruction) to the terminal to query the maximum charging current currently supported by the terminal. The terminal returns to the device the maximum charging current currently supported by itself, and then the fast charging communication procedure goes into stage 4.

Stage 4:

After receiving from the terminal a feedback indicating the maximum charging current supported by the terminal, the device may set an output current reference value. The control unit 107 adjusts the duty ratio of the PWM signal according to the output current reference value, such that the output current of the device meets the charging current requirement of the terminal, and the fast charging communication procedure goes into constant current stage. The constant current stage means that the peak value or mean value of the output current of the device basically remains unchanged (which means that the variation amplitude of the peak value or mean value of the output current is very small, for example within a range of 5% of the peak value or mean value of the output current), namely, the peak value of the current with the third pulsating waveform keeps constant in each period.

Stage 5:

When the fast charging communication procedure goes into the constant current stage, the device sends an instruction 4 (corresponding to the above-mentioned fourth instruction) at intervals to query the current voltage of battery in the terminal. The terminal may feedback to the device the current voltage of the battery, and the device may determine according to the feedback of the current voltage of the battery whether the USB contact is good (i.e., the contact between the first charging interface and the second charging interface) is good and whether it is necessary to decrease the present charging current value of the terminal. When the device determines that the USB contact is poor, the device sends an instruction 5 (corresponding to the above-mentioned fifth instruction), and then the device is reset, such that the fast charging communication procedure goes into stage 1 again.

In some embodiments of the present disclosure, in stage 1, when the terminal replies to the instruction 1, data corresponding to the instruction 1 may carry data (or information) on the path impedance of the terminal. The data on the path impedance of the terminal may be used in stage 5 to determine whether the USB contact is good.

In some embodiments of the present disclosure, in stage 2, the time period from when the terminal agrees to operate in the first charging mode to when the device adjusts the voltage to a suitable value may be controlled to be within a certain range. If the time period exceeds a predetermined range, the terminal may determine that the request is abnormal, thus a quick reset is performed.

In some embodiments of the present disclosure, in stage 2, the terminal may give a feedback indicating that the output voltage of the device is suitable/matching to the device when the output voltage of the device is adjusted to a value higher than the current voltage of the battery by ΔV (ΔV is about 200-500 mV). When the terminal gives a feedback indicating that the output voltage of the device is not suitable (higher or lower) to the device, the control unit 107 adjusts the duty ratio of the PWM signal according to the voltage sampling value, so as to adjust the output voltage of the device.

In some embodiments of the present disclosure, in stage 4, the adjusting speed of the output current value of the device may be controlled to be within a certain range, thus avoiding an abnormal interruption of the fast charging due to a too fast adjusting speed.

In some embodiments of the present disclosure, in stage 5, the variation amplitude of the output current value of the device may be controlled to be within 5%, i.e., stage 5 may be regarded as the constant current stage.

In some embodiments of the present disclosure, in stage 5, the device monitors the impedance of a charging loop in real time, i.e., the device monitors the impedance of the whole charging loop by measuring the output voltage of the device, the present charging current and the read-out voltage of the battery in the terminal. When the impedance of the charging loop >the path impedance of the terminal+the impedance of the fast charging data wire, it may be considered that the USB contact is poor, and thus a fast charging reset is performed.

In some embodiments of the present disclosure, after the first charging mode is initiated, a time interval of communications between the device and the terminal may be controlled to be in a certain range, such that the fast charging reset can be avoided.

In some embodiments of the present disclosure, the stop of the first charging mode (or the fast charging process) may be a recoverable stop or an unrecoverable stop.

For example, when the terminal detects that the battery is fully charged or the USB contact is poor, the fast charging is stopped and reset, and the fast charging communication procedure goes into stage 1. When the terminal disagrees to operate in the first charging mode, the fast charging communication procedure would not go into stage 2. This stop of the fast charging process may be considered as an unrecoverable stop.

For another example, when an abnormal occurs in the communication between the terminal and the device, the fast charging is stopped and reset, and the fast charging communication procedure goes into stage 1. After requirements for stage 1 are met, the terminal agrees to operate in the first charging mode to recover the fast charging process. This stop of the fast charging process may be considered as a recoverable stop.

For another example, when the terminal detects an abnormal occurring in the battery, the fast charging is stopped and reset, and the fast charging communication procedure goes into stage 1. After the fast charging communication procedure goes into stage 1, the terminal disagrees to operate in the first charging mode. Till the battery returns to normal and the requirements for stage 1 are met, the terminal agrees to start the fast charging to recover the fast charging process. This stop of fast charging process may be considered as a recoverable stop.

In an embodiment, communication actions or operations illustrated in FIG. 6 are merely exemplary. For example, in stage 1, after the terminal is coupled to the device, the handshake communication between the terminal and the device may be initiated by the terminal. In other words, the terminal sends an instruction 1 to query the device whether to operate in the first charging mode (or flash charging). When receiving a reply instruction indicating that the device agrees to start the first charging mode from the device, the terminal operates in the fast charging process.

In an embodiment, communication actions or operations illustrated in FIG. 6 are merely exemplary. For example, after stage 5, there may be a constant voltage charging stage. In other words, in stage 5, the terminal may feedback the current voltage of the battery in the terminal to the device. As the voltage of the battery increases continuously, the charging process goes into the constant voltage charging stage when the current voltage of the battery reaches a constant voltage charging voltage threshold. The control unit 107 adjusts the duty ratio of the PWM signal according to the voltage reference value (i.e., the constant voltage charging voltage threshold), such that the output voltage of the device meets the charging voltage requirement of the terminal, i.e., the output voltage of the device basically changes at a constant rate. During the constant voltage charging stage, the charging current decreases gradually. When the current reduces to a certain threshold, the charging is stopped, and at this point, it is indicated that the battery is fully charged. The constant voltage charging refers to that the peak voltage with the third pulsating waveform basically keeps constant.

In embodiments of the present disclosure, acquiring output voltage of the device means that the peak value or mean value of voltage with the third pulsating waveform is acquired. Acquiring output current of the device means that the peak value or mean value of current with the third pulsating waveform is acquired.

Figure 7A:
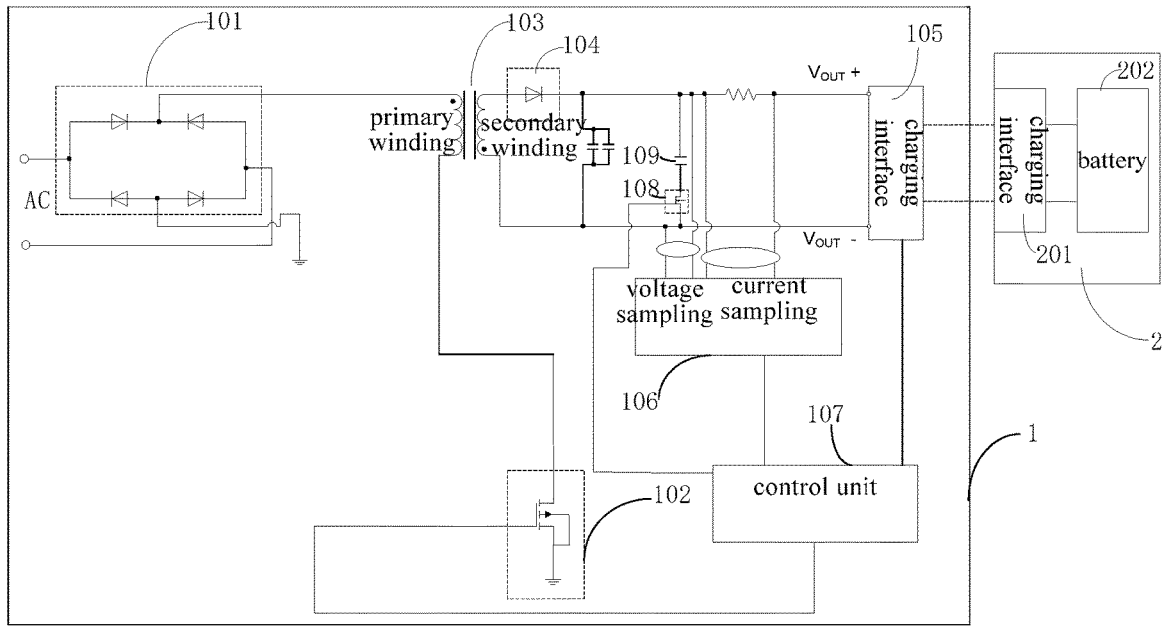
FIG. 7A is a schematic diagram of a charging system according to an embodiment of the present disclosure.
Figure 7B:
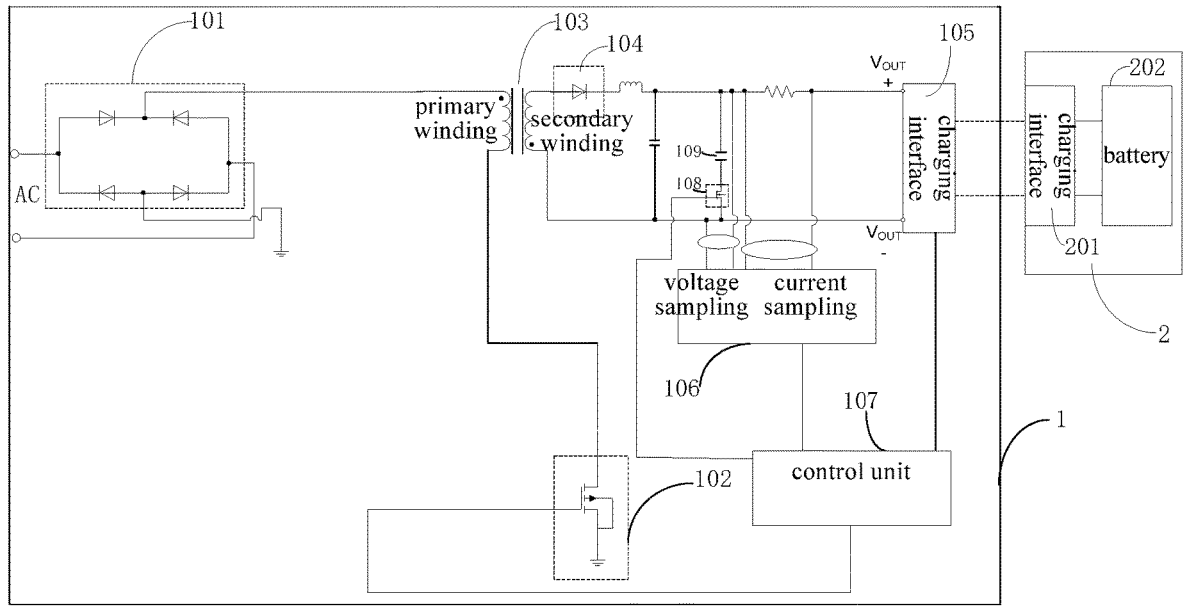
FIG. 7B is a schematic diagram of a device with a LC filter circuit according to an embodiment of the present disclosure.

In an embodiment of the present disclosure, as illustrated in FIG. 7A, the device 1 further includes a controllable switch 108 and a filtering unit 109 coupled in series. The controllable switch 108 and the filtering unit 109 connected in series are coupled to the first output end of the second rectifier 104. The control unit 107 is further configured to control the controllable switch 108 to switch on when determining that the charging mode is the second charging mode, and to control the controllable switch 108 to switch off when determining that the charging mode is the first charging mode. One or more groups of small capacitors are further coupled in parallel to the output end of the second rectifier 104, which can not only achieve noise reduction, but also reduce the occurrence of surge phenomenon. A LC filtering circuit or π type filtering circuit may be further coupled to the output end of the second rectifier 104, so as to filter out pulsating interference. As illustrated in FIG. 7B, an LC filtering circuit is coupled to the output end of the second rectifier 104. In an embodiment, capacitors in the LC filtering circuit or the π type filtering circuit are small capacitors, which occupy small space.

The filtering unit 109 includes a filtering capacitor, which supports a standard charging of 5V in the second charging mode. The controllable switch 108 may be formed of a semiconductor switch element such as a MOS transistor. When the device charges the battery in the terminal in the second charging mode (or standard charging), the control unit 107 controls the controllable switch 108 to switch on so as to incorporate the filtering unit 109 into the circuit, such that the output of the second rectifier 104 can be filtered. In this way, this allows for better compatibility with current charging technology, i.e., the direct current can be applied to the battery in the terminal so as to achieve the direct current charging of the battery. For example, in general, the filtering unit includes an electrolytic capacitor and a common capacitor such as a small capacitor supporting standard charging of 5V (for example, a solid-state capacitor) coupled in parallel. Since the electrolytic capacitor occupies a relatively large volume, in order to reduce the size of the device, the electrolytic capacitor may be removed from the device and only one capacitor with low capacitance is left. When the second charging mode is adopted, a branch where the small capacitor is located can be controlled to switch on to filter the current, so as to realize a stable output with low power to perform a direct current charging on the battery. When the first charging mode is adopted, a branch where the small capacitor is located can be controlled to switch off, and the output of the second rectifier 104, that is, the voltage/current of pulsating waveforms, can be directly applied to the battery without filtering, so as to realize a fast charging of the battery.

With regard to sampling the current outputted by the second rectifier 104, in an embodiment of the present disclosure, the first current sampling circuit 1061 can adopts an operational amplifier with an adjustable amplification factor. As illustrated in FIG. 2B, the amplification factor of the operational amplifier is adjusted by the control unit 107 to suit for different requirements in current detection.

When the control unit 107 determines to charge the terminal in the first charging mode by performing a bidirectional communication with the terminal via the data wire of the first charging interface, a big current may be detected, such that it is required to decrease the amplification factor of the operational amplifier 10611 to prevent saturation of the operational amplifier. When the control unit 107 determines to charge the terminal in the second charging mode by performing the bidirectional communication with the terminal via the data wire of the first charging interface, a small current may be detected, such that it is required to increase the amplification factor of the operational amplifier 10611 to increase a current detection precision of the first current sampling circuit.

In an embodiment of the present disclosure, as illustrated in FIG. 2B, the first current sampling circuit 1061 includes a first resistor R1, a second resistor R2, a third resistor R3, a first filtering capacitor C11, a second filtering capacitor C12 and the operational amplifier 10611. A first end of the first resistor R1 is coupled to an output end of the second rectifier 104. A first end of the second resistor R2 is coupled to the first end of the first resistor R1 and the output end of the second rectifier 104 respectively. A second end of the second resistor R2 is coupled to a first input end of the operational amplifier 10611. A second end of the second resistor R2 is also grounded via the first filtering capacitor C11. A first end of the third resistor R3 is coupled to a second end of the first resistor R1. A second end of the third resistor R3 is coupled to a second input end of the operational amplifier 10611. The second end of the third resistor R3 is also grounded via the second filtering capacitor C12. An adjusting end of the operational amplifier 10611 is coupled to the control unit 107. An output end of the operational amplifier 10611 is coupled to a current sampling end of the control unit 107. The first resistor R1 may be a current detection resistor.

Thus, with the charging system according to the present disclosure, by sampling the current using the operational amplifier with an adjustable amplification factor, the current can be detected precisely in different charging modes, such that both a current detection precision and a dynamic range of the current detection can be ensured, thus enlarging the applying scope.

According to an embodiment of the present disclosure, the control unit 107 is further configured to obtain the charging current and/or the charging voltage in the first charging mode according to the status information of the terminal and to adjust the duty ratio of the control signal such as the PWM signal according to the charging current and/or the charging voltage in the first charging mode, when determining the charging mode as the first charging mode. In other words, when determining the current charging mode as the fast charging mode, the control unit 107 obtains the charging current and/or the charging voltage in the first charging mode according to the obtained status information of the terminal such as the voltage, the electric quantity and the temperature of the battery, running parameters of the terminal, and power consumption information of applications running on the terminal, and adjusts the duty ratio of the control signal according to the obtained charging current and/or the charging voltage, such that the output of the device meets the charging requirement, thus realizing the fast charging of the battery.

The status information of the terminal includes the temperature of the terminal. When the temperature of the battery is greater than a first predetermined temperature threshold, or the temperature of the battery is less than a second predetermined temperature threshold, if the current charging mode is the first charging mode, the first charging mode will be switched to the second charging mode. The first predetermined temperature threshold is greater than the second predetermined temperature threshold. In other words, when the temperature of the battery is too low (for example, corresponding to less than the second predetermined temperature threshold) or too high (for example, corresponding to greater than the first predetermined temperature threshold), it is unsuitable to perform the fast charging, such that it needs to switch from the first charging mode to the second charging mode. In embodiments of the present disclosure, the first predetermined temperature threshold and the second predetermined temperature threshold can be set or can be written into a storage of the control unit (such as the MCU of the device) according to actual situations.

In an embodiment of the present disclosure, the control unit 107 is further configured to control the switch unit 102 to switch off when the temperature of the battery is greater than a predetermined high temperature protection threshold. Namely, when the temperature of the battery exceeds the high temperature protection threshold, the control unit 107 needs to apply a high temperature protection strategy to control the switch unit 102 to switch off, such that the device stops charging the battery, thus realizing high temperature protection of the battery and improving the safety of charging. The high temperature protection threshold may be different from or the same as the first temperature threshold. In an embodiment, the high temperature protection threshold is greater than the first temperature threshold.

In another embodiment of the present disclosure, the controller is further configured to obtain the temperature of the battery, and to control the charging control switch to switch off when the temperature of the battery is greater than the predetermined high temperature protection threshold, that is, the charging control switch can be switched off at the terminal side, so as to stop the charging process of the battery and to ensure the safety of charging.

Moreover, in an embodiment of the present disclosure, the control unit is further configured to obtain a temperature of the first charging interface, and to control the switch unit to switch off when the temperature of the first charging interface is greater than a predetermined protection temperature. In other words, when the temperature of the charging interface exceeds a certain temperature, the control unit 107 needs to apply the high temperature protection strategy to control the switch unit 102 to switch off, such that the device stops charging the battery, thus realizing high temperature protection of the battery and improving the safety of charging.

Certainly, in another embodiment of the present disclosure, the controller performs the bidirectional communication with the control unit to obtain the temperature of the first charging interface. When the temperature of the first charging interface is greater than the predetermined protection temperature, the controller controls the charging control switch to switch off (referring to FIG. 13 and FIG. 14), i.e., switch off the charging control switch at the terminal side, so as to stop the charging process of the battery, thus ensuring the safety of charging.

Figure 8:
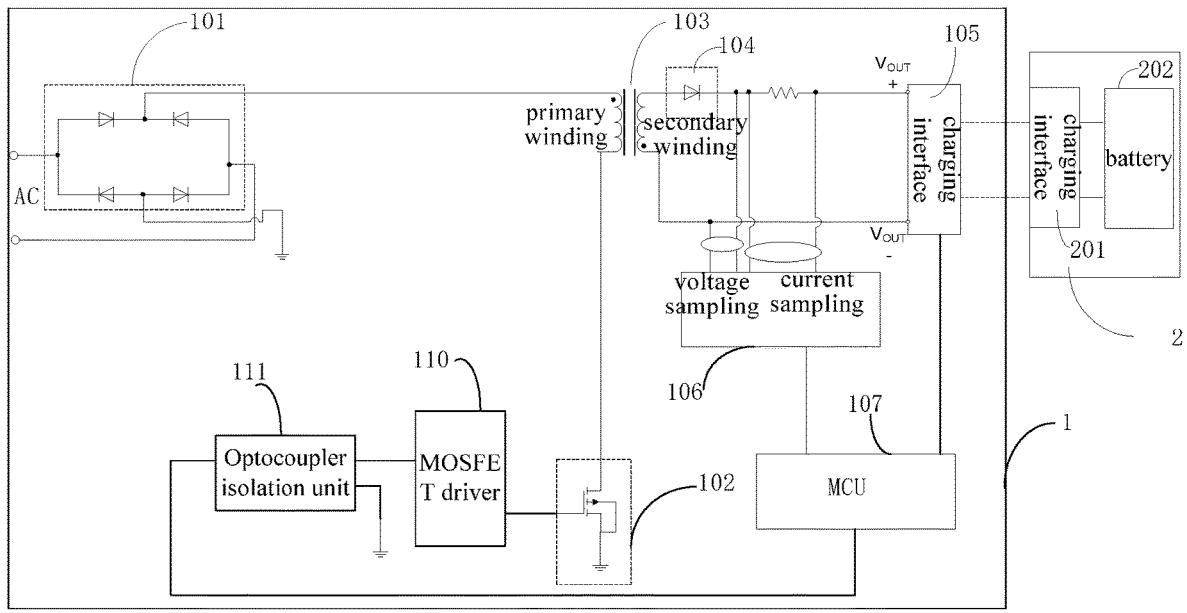
FIG. 8 is a schematic diagram of a charging system according to another embodiment of the present disclosure.

In an embodiment of the present disclosure, as illustrated in FIG. 8, the device 1 further includes a driving unit 110 such as a MOSFET driver. The driving unit 110 is coupled between the switch unit 102 and the control unit 107. The driving unit 110 is configured to drive the switch unit 102 to switch on or switch off according to the control signal. Certainly, in other embodiments of the present disclosure, the driving unit 110 may also be integrated in the control unit 107.

Further, as illustrated in FIG. 8, the device 1 further includes an isolation unit 111. The isolation unit 111 is coupled between the driving unit 110 and the control unit 107, and configured to prevent high voltages from affecting the control unit 107 at the secondary side of the transformer 103 sending signals to or receiving signals from the driving unit 110 at the primary side of the transformer 103, so as to realize high-voltage isolation between the primary side and the secondary side of the device 1 (or high-voltage isolation between the primary winding and the secondary winding of the transformer 103). The isolation unit 111 may be implemented in an optocoupler isolation manner or in other isolation manners. By providing the isolation unit 111, the control unit 107 may be disposed at the secondary side of the device 1 (or the secondary winding side of the transformer 103), thereby facilitating communication with the terminal 2, and the space design of the device 1 can be easier and simpler.

Certainly, in other embodiments of the present disclosure, both the control unit 107 and the driving unit 110 can be disposed at the primary side, in this way, the isolation unit 111 can be disposed between the control unit 107 and the sampling unit 106, and configured to prevent high voltages from affecting the control unit 107 at the secondary side of the transformer 103 sending signals to or receiving signals from the first charging interface 105.

Further, in embodiments of the present disclosure, when the control unit 107 is disposed at the secondary side, an isolation unit 111 is required, and the isolation unit 111 may be integrated in the control unit 107. In other words, when the signal is transmitted from the primary side to the secondary side or from the secondary side to the primary side, an isolation unit is required to realize the high-voltage isolation.

Figure 9:
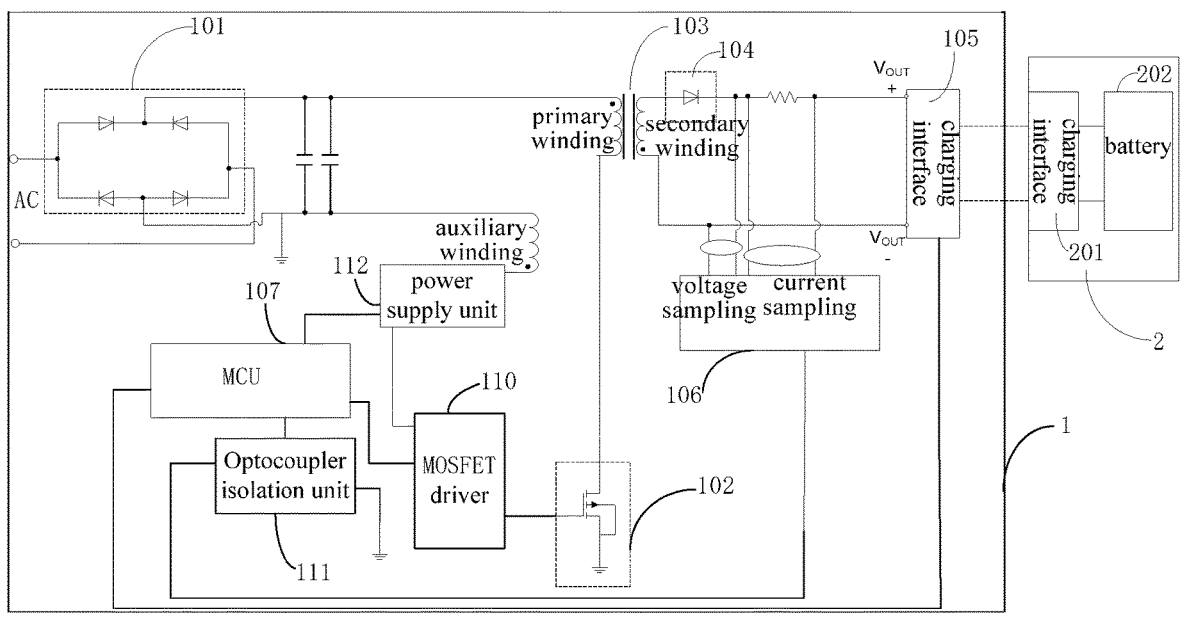
FIG. 9 is a schematic diagram of a charging system according to yet another embodiment of the present disclosure.

In an embodiment of the present disclosure, as illustrated in FIG. 9, the device 1 further includes an auxiliary winding and a power supply unit 112. The auxiliary winding generates a fourth voltage with a fourth pulsating waveform according to the modulated first voltage. The power supply unit 112 is coupled to the auxiliary winding. The power supply unit 112 (for example, including a filtering voltage regulator module, a voltage converting module and the like) is configured to convert the fourth voltage with the fourth pulsating waveform to output a direct current, and to supply power to the driving unit 110 and/or the control unit 107 respectively. The power supply unit 112 may be formed of a small filtering capacitor, a voltage regulator chip or other elements, processing and conversation on the fourth voltage with the fourth pulsating waveform can be achieved to output a low voltage direct current of 3.3V, 5V or the like.

In other words, the power supply of the driving unit 110 can be obtained through a voltage conversation performed on the fourth voltage with the fourth pulsating waveform by the power supply unit 112. When the control unit 107 is disposed at the primary side, the power supply of the control unit 107 can also be obtained through a voltage conversation performed on the fourth voltage with the fourth pulsating waveform by the power supply unit 112. As illustrated in FIG. 9, when the control unit 107 is disposed at the primary side, the power supply unit 112 provides two direct current outputs, so as to supply power to the driving unit 110 and the control unit 107 respectively. An optocoupler isolation unit 111 is arranged between the control unit 107 and the sampling unit 106 to realize the high-voltage isolation between the primary side and the secondary side of the device 1.

When the control unit 107 is disposed at the primary side and integrated with the driving unit 110, the power supply unit 112 supplies power to the control unit 107 separately. When the control unit 107 is disposed at the secondary side and the driving unit 110 is disposed at the primary side, the power supply unit 112 supplies power to the driving unit 110 separately. The power supply to the control unit 107 is realized by the secondary side, for example, the third voltage with the third pulsating waveform outputted by the second rectifier 104 is converted to a direct current through a power supply unit to supply power to the control unit 107.

Moreover, in embodiments of the present disclosure, multiple small capacitors are coupled in parallel to the output end of first rectifier 101 for filtering. Or a LC filtering circuit is coupled to the output end of the first rectifier 110.

Figure 10:
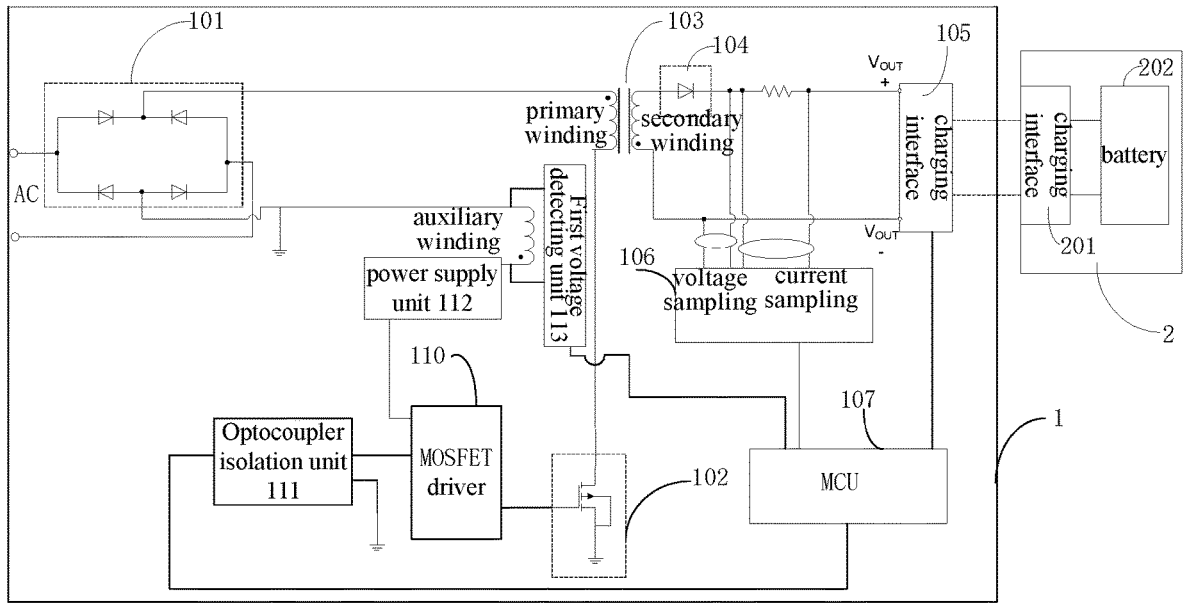
FIG. 10 is a schematic diagram of a charging system according to still another embodiment of the present disclosure.

In another embodiment of the present disclosure, as illustrated in FIG. 10, the device 1 further includes a first voltage detecting unit 113. The first voltage detecting unit 113 is coupled to the auxiliary winding and the control unit 107 respectively. The first voltage detecting unit 113 is configured to detect the fourth voltage to generate a voltage detecting value. The control unit 107 is further configured to adjust the duty ratio of the control signal according to the voltage detecting value.

In other words, the control unit 107 may reflect the voltage outputted by the second rectifier 104, according to the voltage outputted by the secondary winding and detected by the first voltage detecting unit 113, and then adjusts the duty ratio of the control signal according to the voltage detecting value, such that the output of the second rectifier 104 meets the charging requirement of the battery.

Figure 11:
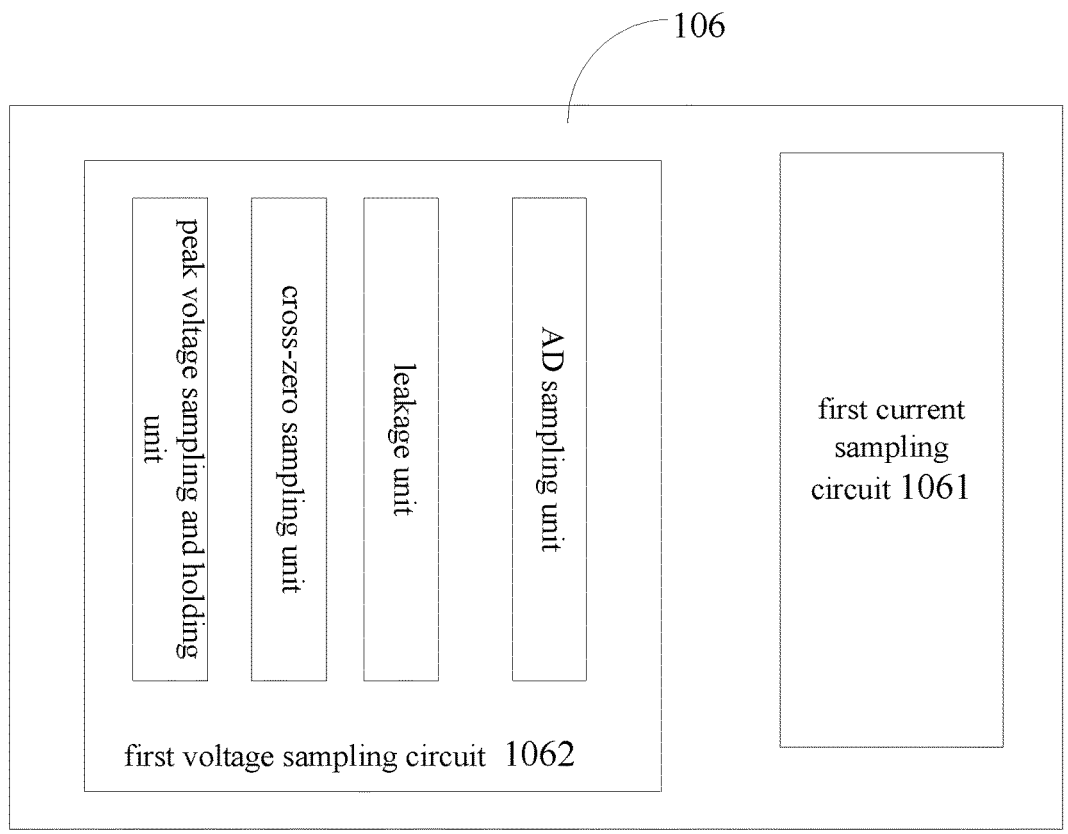
FIG. 11 is a block diagram of a sampling unit according to an embodiment of the present disclosure.

In an embodiment of the present disclosure, as illustrated in FIG. 11, the sampling unit 106 includes a first current sampling circuit 1061 and a first voltage sampling circuit 1062. The first current sampling circuit 1061 is configured to sample the current outputted by the second rectifier 104 so as to obtain the current sampling value. The first voltage sampling circuit 1062 is configured to sample the voltage outputted by the second rectifier 104 so as to obtain the voltage sampling value.

In an embodiment of the present disclosure, the first current sampling circuit 1061 can sample the voltage on a resistor (current detection resistor) coupled to a first output end of the second rectifier 104 so as to sample the current outputted by the second rectifier 104. The first voltage sampling circuit 1062 can sample the voltage cross the first output end and a second output end of the second rectifier 104 so as to sample the voltage outputted by the second rectifier 104.

Moreover, in an embodiment of the present disclosure, as illustrated in FIG. 11, the first voltage sampling circuit 1062 includes a peak voltage sampling and holding unit, a cross-zero sampling unit, a leakage unit and an AD sampling unit. The peak voltage sampling and holding unit is configured to sample and hold a peak voltage of the third voltage. The cross-zero sampling unit is configured to sample a zero crossing point of the third voltage. The leakage unit is configured to perform a leakage on the peak voltage sampling and holding unit at the zero crossing point. The AD sampling unit is configured to sample the peak voltage in the peak voltage sampling and holding unit so as to obtain the voltage sampling value.

By providing the peak voltage sampling and holding unit, the cross-zero sampling unit, the leakage unit and the AD sampling unit in the first voltage sampling circuit 1062, the voltage outputted by the second rectifier 104 may be sampled accurately, and it can be guaranteed that the voltage sampling value is synchronized with the first voltage, i.e., the phase is synchronized and the variation trend of magnitude of the voltage sampling value is consistent with that of the first voltage.

Figure 12:
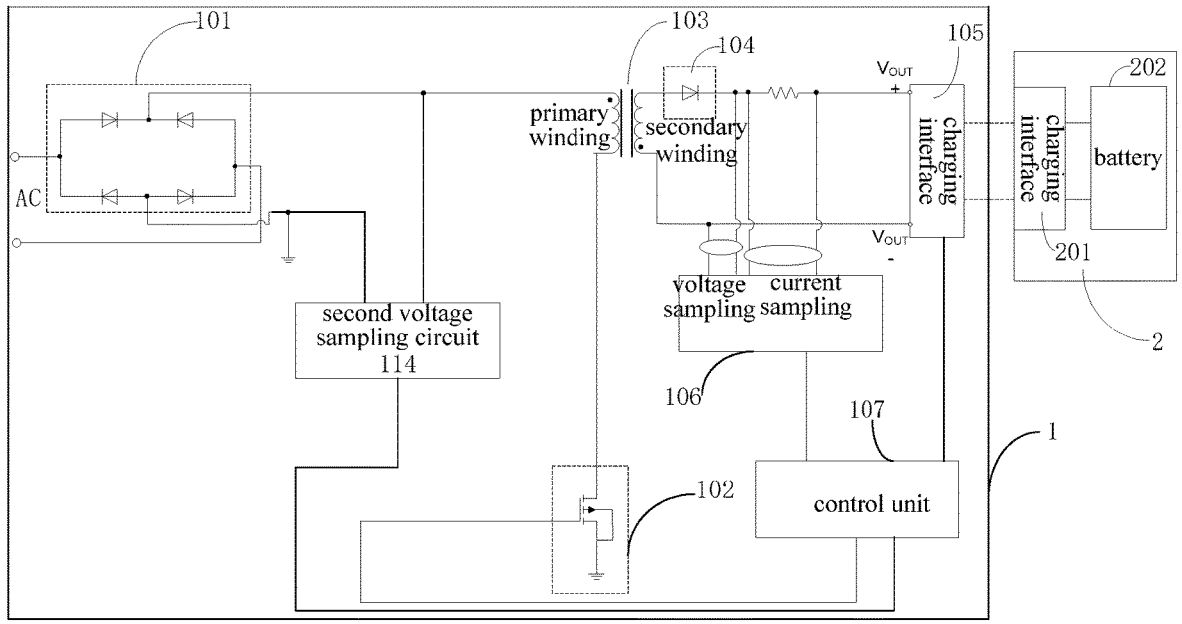
FIG. 12 is a schematic diagram of a charging system according to still yet another embodiment of the present disclosure.

According to an embodiment of the present disclosure, as illustrated in FIG. 12, the device 1 further includes a second voltage sampling circuit 114. The second voltage sampling circuit 114 is configured to sample the first voltage with the first pulsating waveform. The second voltage sampling circuit 114 is coupled to the control unit 107. When the voltage value sampled by the second voltage sampling circuit 114 is greater than a first predetermined voltage value, the control unit 107 controls the switch unit 102 to switch on for a first predetermined time period, to discharge the surge voltage, spike voltage and the like in the first pulsating waveform.

As illustrated in FIG. 12, the second voltage sampling circuit 114 can be coupled to the first output end and the second output end of the first rectifier 101, so as to sample the first voltage with the first pulsating waveform. The control unit 107 judges the voltage value sampled by the second voltage sampling circuit 114. When the voltage value sampled by the second voltage sampling circuit 114 is greater than the first predetermined voltage value, it indicates that the device 1 is suffering a lightning interference and a surge voltage occurs, and at this time, it needs to drain off the surge voltage to ensure the safety and reliability of charging. The control unit 107 controls the switch unit 102 to switch on for a certain time period to form a leakage path, such that the leakage is performed on the surge voltage caused by the lightning is drained off, thus avoiding the lightning interference on the device when charging the terminal, and effectively improving the safety and reliability of the charging of the terminal. The first predetermined voltage value may be determined according to actual situations.

In an embodiment of the present disclosure, during a process that the device 1 charges the battery 202 in the terminal 2, the control unit 107 is further configured to control the switch unit 102 to switch off when the value of the voltage sampled by the sampling unit 106 is greater than a second predetermined voltage value. Namely, the control unit 107 further judges the magnitude of the value of the voltage sampled by the sampling unit 106. When the value of the voltage sampled by the sampling unit 106 is greater than the second predetermined voltage value, it indicates that the voltage outputted by the device 1 is too high. At this time, the control unit 107 controls the switch unit 102 to switch off, such that the device 1 stops charging the battery 202 in the terminal 2. In other words, the control unit 107 realizes the over-voltage protection of the device 1 by controlling the switch unit 102 to switch off, thus ensuring the safety of charging.

Certainly, in an embodiment of the present disclosure, the controller 204 performs a bidirectional communication with the control unit 107 to obtain the value of the voltage sampled by the sampling unit 106 (referring to FIG. 13 and FIG. 14), and controls the charging control switch 203 to switch off when the value of the voltage sampled by the sampling unit 106 is greater than the second predetermined voltage value. Namely, the charging control switch 203 is controlled to switch off at the terminal 2 side, so as to stop the charging process of the battery 202, such that the safety of charging can be ensured.

Further, the control unit 107 is further configured to control the switch unit 102 to switch off when the value of the current sampled by the sampling unit 106 is greater than a predetermined current value. In other words, the control unit 107 is further configured to judge the magnitude of the value of the current sampled by the sampling unit 106. When the value of the current sampled by the sampling unit 106 is greater than the predetermined current value, it indicates that the current outputted by the device 1 is too high. At this time, the control unit 107 controls the switch unit 102 to switch off, such that the device 1 stops charging the terminal. In other words, the control unit 107 realizes the over-current protection of the device 1 by controlling the switch unit 102 to switch off, thus ensuring the safety of charging.

Similarly, the controller 204 performs the bidirectional communication with the control unit 107 to obtain the value of the current sampled by the sampling unit 106 (referring to FIG. 13 and FIG. 14), and controls the charging control switch 203 to switch off when the value of the current sampled by the sampling unit 106 is greater than the predetermined current value. In other words, the charging control switch 203 is controlled to switch off at the terminal 2 side, so as to stop the charging process of the battery 202, thus ensuring the safety of charging.

The second predetermined voltage value and the predetermined current value may be set or written into a storage of the control unit (for example, the control unit 107 of the device 1, such as an MCU) according to actual situations.

In embodiments of the present disclosure, the terminal may be a mobile terminal, such as a mobile phone, a mobile power supply such as a power bank, a multimedia player, a notebook PC, a wearable device or the like.

With the charging system according to embodiments of the present disclosure, the device is controlled to output the third voltage with the third pulsating waveform, and the third voltage with the third pulsating waveform outputted by the device is directly applied to the battery of the terminal, thus realizing fast charging to the battery directly by the pulsating output voltage/current. A magnitude of the pulsating output voltage/current changes periodically, compared with the conventional constant voltage and constant current, lithium precipitation of the lithium battery may be reduced and the service life of the battery may be improved, moreover, the probability and intensity of arc discharge of a contact of a charging interface may be reduced and the service life of the charging interface may be prolonged. Besides, it is beneficial to reduce polarization effect of the battery, improve charging speed, and decrease heat emitted by the battery, thus ensuring the reliability and safety of the terminal during charging. Moreover, since the voltage outputted by the device is a voltage with a pulsating waveform, it is unnecessary to provide an electrolytic capacitor in the device, which not only realizes simplification and miniaturization of the device, but also decreases cost greatly. Furthermore, by adjusting the amplification factor of the operational amplifier in different charging modes, the current outputted by the second rectifier can be detected accordingly, such that both a detection precision and a dynamic range of the current detection is ensured, thus enlarging applying scope.

Embodiments of the present disclosure further provide a device. The device includes a first rectifier, a switch unit, a transformer, a second rectifier, a first charging interface, a first current sampling circuit, a control unit and a first isolation unit. The first rectifier is configured to rectify an input alternating current to output a first voltage with a first pulsating waveform. The switch unit is configured to modulate the first voltage according to a control signal. The transformer is configured to output a second voltage with a second pulsating waveform according to the modulated first voltage. The second rectifier is configured to rectify the second voltage to output a third voltage with a third pulsating waveform, and the third voltage is configured to be applied to a battery in a terminal to charge the battery in the terminal when the device is coupled to the terminal. The first current sampling circuit is configured to sample a current outputted by the second rectifier to obtain a current sampling value, in which the first current sampling circuit includes an operational amplifier with an adjustable amplification factor. The control unit is coupled to the first current sampling circuit and the switch unit respectively, and configured to output the control signal to the switch unit, adjust the amplification factor of the operational amplifier according to a charging mode, and adjust a duty ratio of the control signal according to the current sampling value, such that the third voltage meets a charging requirement when the device is coupled to the terminal.

The device may further include a first charging interface. The first charging interface is coupled to the second rectifier, configured to apply the third voltage to a battery in a terminal via a second charging interface of the terminal when the first charging interface is coupled to the second charging interface, in which the second charging interface is coupled to the battery.

With the device according to embodiments of the present disclosure, the third voltage with the third pulsating waveform is outputted via the first charging interface, and the third voltage is directly applied to the battery of the terminal via the second charging interface of the terminal, thus realizing fast charging of the battery with the pulsating output voltage/current directly. Compared with the conventional constant voltage and constant current, a magnitude of the pulsating output voltage/current changes periodically, and lithium precipitation of the lithium battery may be reduced, the service life of the battery may be improved, moreover, the probability and intensity of arc discharge of a contact of a charging interface may be reduced and the service life of the charging interface may be prolonged. Besides, it is beneficial to reduce polarization effect of the battery, improve charging speed, and decrease heat emitted by the battery, thus ensuring a reliability and safety of the terminal during the charging. Moreover, since the voltage with the pulsating waveform is output, it is unnecessary to provide an electrolytic capacitor, which not only realizes simplification and miniaturization of the device, but also decreases cost greatly. Furthermore, by adjusting the amplification factor of the operational amplifier in different charging modes, the current outputted by the second rectifier can be detected accordingly, such that both a detection precision and a dynamic range of the current detection is ensured, thus enlarging applying scope.

Figure 15:
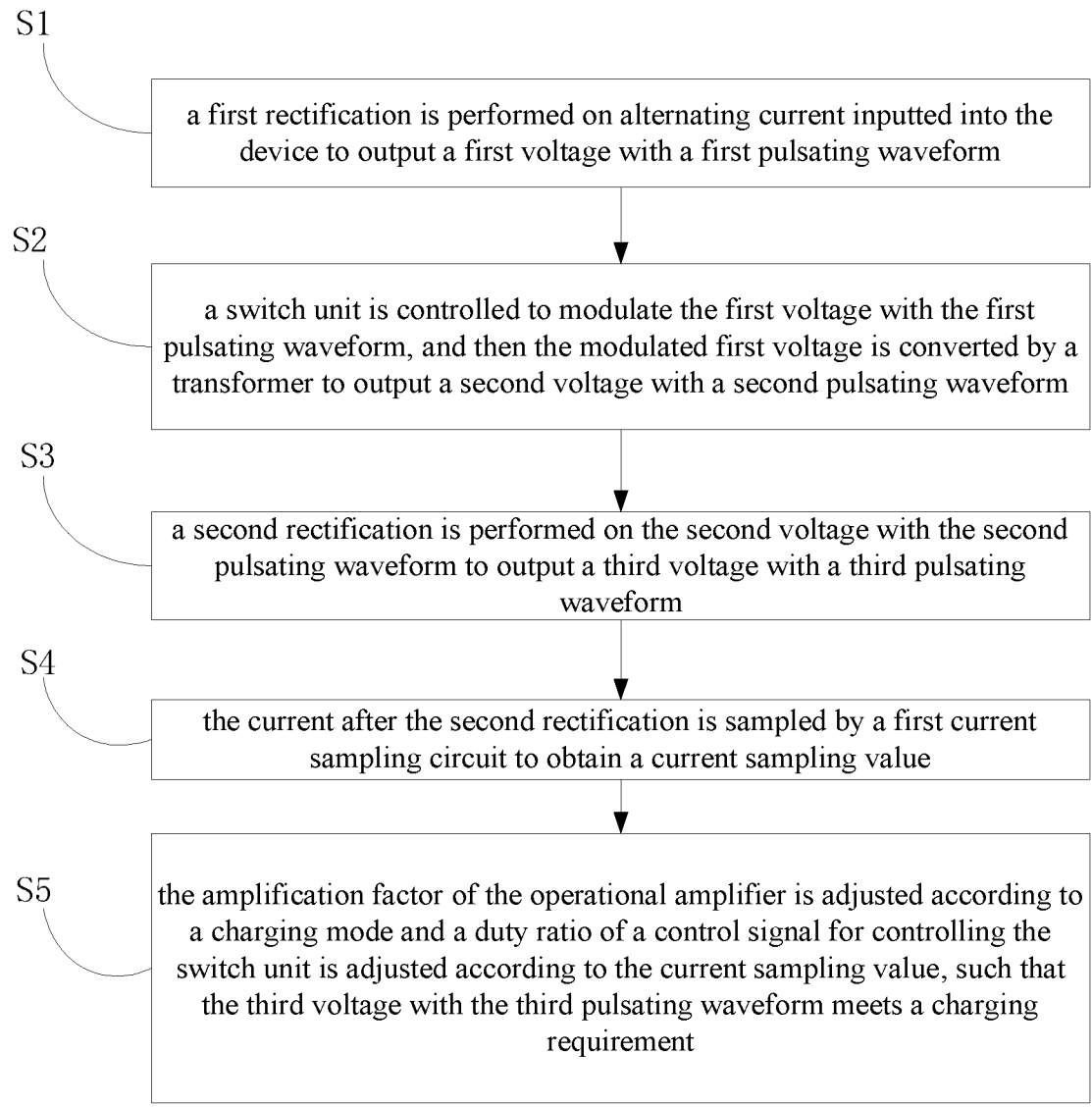
FIG. 15 is a flow chart of a charging method according to embodiments of the present disclosure.

FIG. 15 is a flow chart of a charging method according to embodiments of the present disclosure. As illustrated in FIG. 15, the charging method includes the following.

At block S1, a first rectification is performed on an alternating current inputted into the device to output a first voltage with a first pulsating waveform.

In other words, a first rectifier in the device rectifies the inputted alternating current (i.e., the mains supply, such as an alternating current of 220V, 50 Hz or 60 Hz) and outputs the first voltage (for example, 100 Hz or 120 Hz) with the first pulsating waveform, such as a voltage with a steamed bun waveform.

At block S2, the first voltage with the first pulsating waveform is modulated by a switch unit, and then is converted by a transformer to obtain a second voltage with a second pulsating waveform.

The switch unit may be formed of a MOS transistor. A PWM control is performed on the MOS transistor to perform a chopping modulation on the voltage with the steamed bun waveform. And then, the modulated first voltage is coupled to a secondary side by the transformer, such that the secondary winding outputs the second voltage with the second pulsating waveform.

In an embodiment of the present disclosure, a high-frequency transformer can be used for conversion, in this way, the size of the transformer can be small, thus realizing high-power and miniaturization of the device.

At block S3, a second rectification is performed on the second voltage with the second pulsating waveform to output a third voltage with a third pulsating waveform. The third voltage with the third pulsating waveform may be applied to a battery of the terminal via the second charging interface, so as to charge the battery of the terminal.

In an embodiment of the present disclosure, the second rectification is performed on the second voltage with the second pulsating waveform by a second rectifier. The second rectifier may be formed of diodes or MOS transistors, and can realize a secondary synchronous rectification, such that the third pulsating waveform keeps synchronous with the waveform of the modulated first voltage.

At block S4, the current after the second rectification is sampled by a first current sampling circuit to obtain a current sampling value. The first current sampling circuit comprises an operational amplifier with an adjustable amplification factor.

At block S5, the amplification factor of the operational amplifier is adjusted according to a charging mode and a duty ratio of a control signal outputted to the switch unit is adjusted according to the current sampling value, such that the third voltage with the third pulsating waveform meets a charging requirement when the device is coupled to the terminal.

According to an embodiment of the present disclosure, a frequency of the control signal is adjusted according to the current sample value.

Further, a voltage after the second rectification can be sampled to obtain a voltage sample value, and the duty ratio of the control signal for controlling the switch unit according to the current sampling value, such that the third voltage meets the charging requirement.

In an embodiment, the third voltage with the third pulsating waveform meeting the charging requirement means that, the third voltage and current with the third pulsating waveform need to meet the charging voltage and charging current for charging the batter. In other words, the duty ratio of the control signal (such as a PWM signal) can be adjusted according to the sampled voltage and/or current outputted by the device, so as to adjust the output of the device in real time and realize a closed-loop adjustment control, such that the third voltage with the third pulsating waveform meets the charging requirement of the terminal, thus ensuring the stable and safe charging of the battery. In an embodiment, a waveform of a charging voltage outputted to a battery is illustrated in FIG. 3, in which the waveform of the charging voltage is adjusted according to the duty ratio of the PWM signal. A waveform of a charging current outputted to a battery is illustrated in FIG. 4, in which the waveform of the charging current is adjusted according to the duty ratio of the PWM signal.

In an embodiment of the present disclosure, by controlling the switch unit, a chopping modulation can be directly performed on the first voltage with the first pulsating waveform after a full-bridge rectification, i.e., the steamed bun waveform, and then the modulated voltage is sent to the high-frequency transformer and coupled from the primary side to the secondary side via the high-frequency transformer, and then is restored to the voltage/current with the steamed bun waveform after a synchronous rectification. The voltage/current with the steamed bun waveform is directly transmitted to the battery to realize fast charging of the battery. The magnitude of the voltage with the steamed bun waveform may be adjusted according to the duty ratio of the PWM signal, such that the output of the device meets the charging requirement of the battery. It can be seen, electrolytic capacitors at the primary side and the secondary side in the device can be removed, and the battery can be directly charged via the voltage with the steamed bun waveform, such that the size of the device may be reduced, thus realizing miniaturization of the device, and decreasing the cost greatly.

In an embodiment of the present disclosure, when it is determined to charge the terminal in the first charging mode by performing a bidirectional communication with the terminal via the data wire of the first charging interface, the amplification factor of the operational amplifier is decreased to prevent saturation of the operational amplifier. When it is determined to charge the terminal in the second charging mode by performing a bidirectional communication with the terminal via the data wire of the first charging interface, the amplification factor of the operational amplifier is increased to increase a current detection precision of the first current sampling circuit.

According to an embodiment of the present disclosure, a frequency of the control signal is adjusted according to the voltage sampling value and/or the current sampling value. That is, the PWM signal outputted to the switch unit is controlled to continuously output for a time period, and then the output of the PWM signal is stopped for a predetermined time period and then restarted. In this way, the voltage applied to the battery is intermittent, thus realizing the intermittent charging of the battery, which avoids a safety hazard caused by heating phenomenon occurring when the battery is charged continuously and improves the reliability and safety of the charging to the battery. The control signal outputted to the switch unit is illustrated in FIG. 5.

Further, the above charging method includes: performing a communication with the terminal via the first charging interface to obtain status information of the terminal, and adjusting the duty ratio of the control signal according to the status information of the terminal, the voltage sampling value and/or current sampling value.

In other words, when the second charging interface is coupled to the first charging interface, the device and the terminal may send communication query instructions to each other, and a communication connection can be established between the device and the terminal after a corresponding reply instruction is received, such that the device can obtain the status information of the terminal, negotiate with the terminal about the charging mode and charging parameters (such as the charging current, the charging voltage) and control the charging process.

According to an embodiment of the present disclosure, a fourth voltage with a fourth pulsating waveform can be generated through a conversion of the transformer, and the fourth voltage with the fourth pulsating waveform can be detected to generate a voltage detecting value, so as to adjust the duty ratio of the control signal according to the voltage detecting value.

In an embodiment, the transformer can be provided with an auxiliary winding. The auxiliary winding can generate the fourth voltage with the fourth pulsating waveform according to the modulated first voltage. The output voltage of the device can be reflected by detecting the fourth voltage with the fourth pulsating waveform, and the duty ratio of the control signal can be adjusted according to the voltage detecting value, such that the output of the device meets the charging requirement of the battery.

In an embodiment of the present disclosure, sampling the voltage after the second rectification to obtain the voltage sampling value includes: sampling and holding a peak value of the voltage after the second rectification, and sampling a zero crossing point of the voltage after the second rectification; performing a leakage on a peak voltage sampling and holding unit configured for sampling and holding the peak voltage at the zero crossing point; sampling the peak voltage in the peak voltage sampling and holding unit so as to obtain the voltage sampling value. In this way, accurate sampling on the voltage outputted by the device can be achieved, and it can be guaranteed that the voltage sampling value keeps synchronous with the first voltage with the first pulsating waveform, i.e., the phase and the variation trend of magnitude of the voltage sampling value are consistent with those of the first voltage respectively.

Further, in an embodiment of the present disclosure, the above charging method includes: sampling the first voltage with the first pulsating waveform, and controlling the switch unit to switch on for a predetermined time period to discharge the surge voltage in the first pulsating waveform when a sampled voltage value is greater than a first predetermined voltage value.

The first voltage with the first pulsating waveform is sampled, and then the sampled voltage value is judged. When the sampled voltage value is greater than the first predetermined voltage value, it indicates that the device is suffering a lightning interference and a surge voltage occurs, and at this point, it needs to drain off the surge voltage for ensuring the safety and reliability of charging. It is required to control the switch unit to switch on for a certain time period, to form a leakage path, such that the surge voltage caused by the lightning is drained off, thus avoiding lightning interference on the device when charging the terminal, and effectively improving the safety and reliability of the charging of the terminal. The first predetermined voltage value may be determined according to actual situations.

According an embodiment of the present disclosure, a communication with the terminal is performed via the first charging interface to determine a charging mode. When it is determined that the charging mode is the first charging mode, the charging current and/or charging voltage in the first charging mode can be obtained according to the status information of the terminal, so as to adjust the duty ratio of the control signal according to the charging current and/or charging voltage in the first charging mode. The charging mode includes the first charging mode and the second charging mode.

In other words, when it is determined that the current charging mode is the first charging mode, the charging current and/or charging voltage in the first charging mode can be obtained according to the obtained status information of the terminal, such as the voltage, electric quantity, temperature of the battery, running parameters of the terminal and power consumption information of applications running on the terminal or the like. The duty ratio of the control signal is adjusted according to the obtained charging current and/or charging voltage, such that the output of the device meets the charging requirement, thus realizing the fast charging of the terminal.

The status information of the terminal includes the temperature of the battery. When the temperature of the battery is greater than a first predetermined temperature threshold, or the temperature of the battery is less than a second predetermined temperature threshold, if the current charging mode is the first charging mode, the first charging mode is switched to the second charging mode. The first predetermined temperature threshold is greater than the second predetermined temperature threshold. In other words, when the temperature of the battery is too low (for example, corresponding to less than the second predetermined temperature threshold) or too high (for example, corresponding to greater than the first predetermined temperature threshold), it is unsuitable for fast charging; therefore, it needs to switch from the first charging mode to the second charging mode. In embodiments of the present disclosure, the first predetermined temperature threshold and the second predetermined temperature threshold can be set according to actual situations.

In an embodiment of the present disclosure, the switch unit is controlled to switch off when the temperature of the battery is greater than a predetermined high temperature protection threshold. Namely, when the temperature of the battery exceeds the high temperature protection threshold, a high temperature protection strategy will be required to control the switch unit to switch off, such that the device stops charging the battery, thus realizing high temperature protection of the battery and improving the safety of charging. The high temperature protection threshold may be different from or the same as the first temperature threshold. In an embodiment, the high temperature protection threshold is greater than the first temperature threshold.

In another embodiment of the present disclosure, the terminal further obtains the temperature of the battery, and controls to stop charging the battery (for example, by controlling a charging control switch to switch off at the terminal side) when the temperature of the battery is greater than the predetermined high temperature protection threshold, so as to stop the charging process of the battery and to ensure the safety of charging.

Moreover, in an embodiment of the present disclosure, the charging method further includes: obtaining a temperature of the first charging interface, and controlling the switch unit to switch off when the temperature of the first charging interface is greater than a predetermined protection temperature. In other words, when the temperature of the charging interface exceeds a certain temperature, the control unit needs to apply the high temperature protection strategy to control the switch unit to switch off, such that the device stops charging the battery, thus realizing the high temperature protection of the battery and improving the safety of charging.

Certainly, in another embodiment of the present disclosure, the terminal performs the bidirectional communication with the device via the second charging interface to obtain the temperature of the first charging interface. When the temperature of the first charging interface is greater than the predetermined protection temperature, the terminal controls to stop charging the battery. That is, the charging control switch can be switched off at the terminal side, so as to stop the charging process of the battery, thus ensuring the safety of charging.

During a process that the device charges the terminal, the switch unit is controlled to switch off when the voltage sampling value is greater than a second predetermined voltage value. Namely, in the process of charging the terminal, the device judges the magnitude of the voltage sampling value. When the voltage sampling value is greater than the second predetermined voltage value, it indicates that the voltage outputted by the device is too high. At this time, the device is controlled to stop charging the terminal by controlling the switch unit to switch off. In other words, the over-voltage protection of the device is realized by controlling the switch unit to switch off, thus ensuring the safety of charging.

Certainly, in an embodiment of the present disclosure, the terminal performs a bidirectional communication with the device via the second charging interface to obtain the voltage sampling value, and controls to stop charging the battery when the voltage sampling value is greater than the second predetermined voltage value. Namely, the charging control switch is controlled to switch off at the terminal side, so as to stop the charging process, such that the safety of charging can be ensured.

In an embodiment of the present disclosure, during the process that the device charges the terminal, the switch unit is controlled to switch off when the current sampling value is greater than a predetermined current value. In other words, during the process that the device charges the terminal, the device judges the magnitude of the current sampling value. When the current sampling value is greater than the predetermined current value, it indicates that the current outputted by the device is too high. At this time, the device is controlled to stop charging the terminal by controlling the switch unit to switch off. In other words, the over-current protection of the device is realized by controlling the switch unit to switch off, thus ensuring the safety of charging.

Similarly, the terminal performs the bidirectional communication with the device via the second charging interface to obtain the current sampling value, and controls to stop charging the battery when the current sampling value is greater than the predetermined current value. In other words, the charging control switch is controlled to be switched off at the terminal side, such that the charging process of the battery is stopped, thus ensuring the safety of charging.

The second predetermined voltage value and the predetermined current value may be set according to actual situations.

In embodiments of the present disclosure, the status information of the terminal may include the electric quantity of the battery, the temperature of the battery, the voltage/current of the battery of the terminal, interface information of the terminal and information on path impedance of the terminal.

In an embodiment, the device can be coupled to the terminal via a USB interface. The USB interface may be a general USB interface, or a micro USB interface. A data wire in the USB interface, that is, the data wire in the first charging interface, is configured for the bidirectional communication between the device and the terminal. The data wire may be D+ and/or D− wire in the USB interface. The bidirectional communication may refer to an information interaction performed between the device and the terminal.

The device performs the bidirectional communication with the terminal via the data wire in the USB interface, so as to determine to charge the terminal in the first charging mode.

As an embodiment, when the device performs the bidirectional communication with the terminal via the first charging interface so as to determine to charge the terminal in the first charging mode, the device sends a first instruction to the terminal. The first instruction is configured to query the terminal whether to operate in the first charging mode. The device receives a reply instruction of the first instruction from the terminal. The reply instruction of the first instruction is configured to indicate that the terminal agrees to operate in the first charging mode.

As an embodiment, before the device sends the first instruction to the terminal, the device charges the terminal in the second charging mode. When the device determines that a charging duration of the second charging mode is greater than a predetermined threshold, the device sends the first instruction to the terminal.

In an embodiment, when the device determines that the charging duration of the second charging mode is greater than the predetermined threshold, the device may determine that the terminal has identified it (that is, the device) as a power device, such that the fast charging query communication may start.

As an embodiment, the device is controlled to adjust a charging current to a charging current in the first charging mode by controlling the switch unit. Before the device charges the terminal with the charging current in the first charging mode, a bidirectional communication is performed with the terminal via the first charging interface to determine a charging voltage in the first charging mode, and the device is controlled to adjust a charging voltage to the charging voltage in the first charging mode.

As an embodiment, performing the bidirectional communication with the terminal via the first charging interface to determine the charging voltage in the first charging mode includes: sending by the device a second instruction to the terminal, receiving by the device a reply instruction of the second instruction sent from the terminal, and determining by the device the charging voltage in the first charging mode according to the reply instruction of the second instruction. The second instruction is configured to query whether a current output voltage of the device is suitable as the charging voltage in the first charging mode. The reply instruction of the second instruction is configured to indicate that the current output voltage of the device is suitable, high or low.

As an embodiment, before controlling the device to adjust the charging current to the charging current in the first charging mode, the bidirectional communication with the terminal is performed via the first charging interface to determine the charging current in the first charging mode.

As an embodiment, performing the bidirectional communication with the terminal via the first charging interface to determine the charging current in the first charging mode includes: sending by the device a third instruction to the terminal, receiving by the device a reply instruction of the third instruction sent from the terminal and determining by the device the charging current in the first charging mode according to the reply instruction of the third instruction. The third instruction is configured to query a maximum charging current currently supported by the terminal. The reply instruction of the third instruction is configured to indicate the maximum charging current currently supported by the terminal.

The device may determine the above maximum charging current as the charging current in the first charging mode, or may set the charging current as a charging current less than the maximum charging current.

As an embodiment, during the process that the device charges the terminal in the first charging mode, the bidirectional communication is performed with the terminal via the first charging interface, so as to continuously adjust a charging current outputted to the battery from the device by controlling the switch unit.

The device may query the status information of the terminal continuously, so as to adjust the charging current continuously, for example, query the voltage of the battery of the terminal, the electric quantity of the battery, etc.

As an embodiment, performing the bidirectional communication with the terminal via the first charging interface to continuously adjust the charging current outputted to the battery from the device by controlling the switch unit includes: sending by the device a fourth instruction to the terminal, receiving by the device a reply instruction of the fourth instruction sent by the terminal, in which the fourth instruction is configured to query a current voltage of the battery in the terminal, and adjusting the charging current by controlling the switch unit according to the current voltage of the battery. The reply instruction of the fourth instruction is configured to indicate the current voltage of the battery in the terminal.

As an embodiment, adjusting the charging current by controlling the switch unit according to the current voltage of the battery includes: adjusting the charging current outputted to the battery from the device to a charging current value corresponding to the current voltage of the battery by controlling the switch unit according to the current voltage of the battery and a predetermined correspondence between battery voltage values and charging current values.

In an embodiment, the device may store the correspondence between battery voltage values and charging current values in advance.

As an embodiment, during the process that the device charges the terminal in the first charging mode, the device further performs the bidirectional communication with the terminal via the first charging interface so as to whether the first charging interface and the second charging interface are in poor contact. When it is determined that the first charging interface and the second charging interface are in poor contact, the device is controlled to quit the first charging mode.

As an embodiment, before determining whether the first charging interface and the second charging interface are in poor contact, the device receives information indicating path impedance of the terminal from the terminal. The device sends a fourth instruction to the terminal. The fourth instruction is configured to query a current voltage of the battery in the terminal. The device receives a reply instruction of the fourth instruction sent by the terminal. The reply instruction of the fourth instruction is configured to indicate the current voltage of the battery in the terminal. The device determines path impedance from the device to the battery according to an output voltage of the device and the current voltage of the battery and determines whether the first charging interface and the second charging interface are in poor contact according to the path impedance from the device to the battery, the path impedance of the terminal, and path impedance of a charging circuit between the device and the terminal.

As an embodiment, before the device is controlled to quit the first charging mode, a fifth instruction is sent to the terminal. The fifth instruction is configured to indicate that the first charging interface and the second charging interface are in poor contact.

After sending the fifth instruction, the device may quit the first charging mode or reset.

The fast charging process according to embodiments of the present disclosure has been described from the perspective of the device; hereinafter, the fast charging process according to embodiments of the present disclosure will be described from the perspective of the terminal in the following.

In embodiments of the present disclosure, the terminal supports the first charging mode and the second charging mode. The charging current of the first charging mode is greater than that of the second charging mode. The terminal performs the bidirectional communication with the device via the second charging interface such that the device determines to charge the terminal in the first charging mode. The device outputs according to a charging current in the first charging mode to charge the battery in the terminal.

As an embodiment, performing by the terminal the bidirectional communication with the device via the second charging interface such that the device determines to charge the terminal in the first charging mode includes: receiving by the terminal the first instruction sent by the device, in which the first instruction is configured to query the terminal whether to operate in the first charging mode; sending by the terminal a reply instruction of the first instruction to the device. The reply instruction of the first instruction is configured to indicate that the terminal agrees to operate in the first charging mode.

As an embodiment, before the terminal receives the first instruction sent by the device, the battery in the terminal is charged by the device in the second charging mode. When the device determines that a charging duration of the second charging mode is greater than a predetermined threshold, the terminal receives the first instruction sent by the device.

As an embodiment, before the device outputs according to the charging current in the first charging mode to charge the battery in the terminal, the terminal performs the bidirectional communication with the device via the second charging interface, such that the device determines the charging voltage in the first charging mode.

As an embodiment, performing by the terminal the bidirectional communication with the device via the second charging interface such that the device determines the charging voltage in the first charging mode includes: receiving by the terminal a second instruction sent by the device, and sending by the terminal a reply instruction of the second instruction to the device. The second instruction is configured to query whether a current output voltage of the device is suitable as the charging voltage in the first charging mode. The reply instruction of the second instruction is configured to indicate that the current output voltage of the device is suitable, high or low.

As an embodiment, before the terminal receives the charging current in the first charging mode from the device to charge the battery in the terminal, the terminal performs the bidirectional communication with the device via the second charging interface, such that the device determines the charging current in the first charging mode.

Performing by the terminal the bidirectional communication with the device via the second charging interface such that the device determines the charging current in the first charging mode includes: receiving by the terminal a third instruction sent by the device, in which the third instruction is configured to query a maximum charging current currently supported by the terminal; sending by the terminal a reply instruction of the third instruction to the device, in which the reply instruction of the third instruction is configured to indicate the maximum charging current currently supported by the terminal, such that the device determines the charging current in the first charging mode according to the maximum charging current.

As an embodiment, during a process that the device charges the terminal in the first charging mode, the terminal performs the bidirectional communication with the device via the second charging interface, such that the device continuously adjusts a charging current outputted to the battery.

Performing by the terminal the bidirectional communication with the device via the second charging interface such that the device continuously adjusts the charging current outputted to the battery includes: receiving by the terminal a fourth instruction sent by the device, in which the fourth instruction is configured to query a current voltage of the battery in the terminal; sending by the terminal a reply instruction of the fourth instruction to the device, in which the reply instruction of the fourth instruction is configured to indicate the current voltage of the battery in the terminal, such that the device continuously adjusts the charging current outputted to the battery according to the current voltage of the battery.

As an embodiment, during the process that the device charges the terminal in the first charging mode, the terminal performs the bidirectional communication with the device via the second charging interface, such that the device determines whether the first charging interface and the second charging interface are in poor contact.

Performing by the terminal the bidirectional communication with the device via the second charging interface, such that the device determines whether the first charging interface and the second charging interface are in poor contact includes: receiving by the terminal a fourth instruction sent by the device, in which the fourth instruction is configured to query a current voltage of the battery in the terminal; sending by the terminal a reply instruction of the fourth instruction to the device, in which the reply instruction of the fourth instruction is configured to indicate the current voltage of the battery in the terminal, such that the device determines whether the first charging interface and the second charging interface are in poor contact according to an output voltage of the device and the current voltage of the battery.

As an embodiment, the terminal receives a fifth instruction sent by the device. The fifth instruction is configured to indicate that the first charging interface and the second charging interface are in poor contact.

In order to initiate and adopt the first charging mode, the device may perform a fast charging communication procedure with the terminal, for example, by one or more handshakes, so as to realize the fast charging of battery can be achieved through one or more handshakes. Referring to FIG. 6, the fast charging communication procedure according to embodiments of the present disclosure and respective stages in the fast charging process will be described in detail. In an embodiment, communication actions or operations illustrated in FIG. 6 are merely exemplary. Other operations or various modifications of respective operations in FIG. 6 can be implemented in embodiments of the present disclosure. In addition, respective stages in FIG. 6 may be executed in an order different from that illustrated in FIG. 6, and it is unnecessary to execute all the operations illustrated in FIG. 6.

In conclusion, with the charging method according to embodiments of the present disclosure, the device is controlled to output the third voltage with the third pulsating waveform which meets the charging requirement, and the third voltage with the third pulsating waveform outputted by the device is directly applied to the battery of the terminal, thus realizing fast charging of the battery by applying the pulsating output voltage/current directly. In contrast to the conventional constant voltage and constant current, a magnitude of the pulsating output voltage/current changes periodically, such that a lithium precipitation of the lithium battery may be reduced, the service life of the battery may be improved, moreover, the probability and intensity of arc discharge of a contact of a charging interface may be reduced and the service life of the charging interface may be prolonged. Besides, it is beneficial to reduce polarization effect of the battery, improve charging speed, and decrease heat emitted by the battery, thus ensuring a reliability and safety of the terminal during the charging. Moreover, since the device outputs the voltage with the pulsating waveform, it is unnecessary to provide an electrolytic capacitor in the device, which not only realizes simplification and miniaturization of the device, but also decreases cost greatly. Furthermore, by adjusting the amplification factor of the operational amplifier in different charging modes, the current outputted by the second rectifier can be detected accordingly, such that both a detection precision and a dynamic range of the current detection is ensured, thus enlarging applying scope.

In the specification of the present disclosure, it is to be understood that terms such as "central," "longitudinal," "lateral," "length," "width," "thickness," "upper," "lower," "front," "rear," "left," "right," "vertical," "horizontal," "top," "bottom," "inner," "outer," "clockwise," "counter-clockwise," "axial," "radial," and "circumference" refer to the orientations and location relations which are the orientations and location relations illustrated in the drawings, and for describing the present disclosure and for describing in simple, and which are not intended to indicate or imply that the device or the elements are disposed to locate at the specific directions or are structured and performed in the specific directions, which could not to be understood to the limitation of the present disclosure.

In addition, terms such as "first" and "second" are used herein for purposes of description and are not intended to indicate or imply relative importance or significance or to imply the number of indicated technical features. Thus, the feature defined with "first" and "second" may comprise one or more of this feature. In the description of the present disclosure, "a plurality of" means two or more than two, unless specified otherwise.

In the present disclosure, unless specified or limited otherwise, the terms "mounted," "connected," "coupled," "fixed" and the like are used broadly, and may be, for example, fixed connections, detachable connections, or integral connections; may also be mechanical or electrical connections; may also be direct connections or indirect connections via intervening structures; may also be inner communications of two elements, which can be understood by those skilled in the art according to specific situations.

In the present disclosure, unless specified or limited otherwise, a structure in which a first feature is "on" or "below" a second feature may include an embodiment in which the first feature is in direct contact with the second feature, and may also include an embodiment in which the first feature and the second feature are not in direct contact with each other, but are contacted via an additional feature formed therebetween. Furthermore, a first feature "on," "above," or "on top of" a second feature may include an embodiment in which the first feature is right or obliquely "on," "above," or "on top of" the second feature, or just means that the first feature is at a height higher than that of the second feature; while a first feature "below," "under," or "on bottom of" a second feature may include an embodiment in which the first feature is right or obliquely "below," "under," or "on bottom of" the second feature, or just means that the first feature is at a height lower than that of the second feature.

Reference throughout this specification to "an embodiment," "some embodiments," "one embodiment", "another example," "an example," "a specific example," or "some examples," means that a particular feature, structure, material, or characteristic described in connection with the embodiment or example is included in at least one embodiment or example of the present disclosure. Thus, the appearances of the phrases such as "in some embodiments," "in one embodiment", "in an embodiment", "in another example," "in an example," "in a specific example," or "in some examples," in various places throughout this specification are not necessarily referring to the same embodiment or example of the present disclosure. Furthermore, the particular features, structures, materials, or characteristics may be combined in any suitable manner in one or more embodiments or examples.

Those skilled in the art may be aware that, in combination with the examples described in the embodiments disclosed in this specification, units and algorithm steps can be implemented by electronic hardware, or a combination of computer software and electronic hardware. In order to clearly illustrate interchangeability of the hardware and software, components and steps of each example are already described in the description according to the function commonalities. Whether the functions are executed by hardware or software depends on particular applications and design constraint conditions of the technical solutions. Persons skilled in the art may use different methods to implement the described functions for each particular application, but it should not be considered that the implementation goes beyond the scope of the present disclosure.

Those skilled in the art may be aware that, with respect to the working process of the system, the device and the unit, reference is made to the part of description of the method embodiment for simple and convenience, which are described herein.

In embodiments of the present disclosure, it should be understood that, the disclosed system, device and method may be implemented in other way. For example, embodiments of the described device are merely exemplary. The partition of units is merely a logical function partitioning. There may be other partitioning ways in practice. For example, several units or components may be integrated into another system, or some features may be ignored or not implemented. Further, the coupling between each other or directly coupling or communication connection may be implemented via some interfaces. The indirect coupling or communication connection may be implemented in an electrical, mechanical or other manner.

In embodiments of the present disclosure, it should be understood that, the units illustrated as separate components can be or not be separated physically, and components described as units can be or not be physical units, i.e., can be located at one place, or can be distributed onto multiple network units. It is possible to select some or all of the units according to actual needs, for realizing the objective of embodiments of the present disclosure.

In addition, each functional unit in the present disclosure may be integrated in one progressing module, or each functional unit exists as an independent unit, or two or more functional units may be integrated in one module.

If the integrated module is embodied in software and sold or used as an independent product, it can be stored in the computer readable storage medium. Based on this, the technical solution of the present disclosure or a part making a contribution to the related art or a part of the technical solution may be embodied in a manner of software product. The computer software produce is stored in a storage medium, including some instructions for causing one computer device (such as a personal PC, a server, or a network device etc.) to execute all or some of steps of the method according to embodiments of the present disclosure. The above-mentioned storage medium may be a medium able to store program codes, such as, USB flash disk, mobile hard disk drive (mobile HDD), read-only memory (ROM), random-access memory (RAM), a magnetic tape, a floppy disc, an optical data storage device, and the like.

Although explanatory embodiments have been illustrated and described, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:

1. A charging system for a terminal, comprising a power adapter, the adapter comprising a first rectifier, the first rectifier rectifying an input alternating current to output a first voltage with a first pulsating waveform, wherein the power adapter further comprises:
 a switch unit, configured to modulate the first voltage according to a control signal;
 a transformer, configured to output a second voltage with a second pulsating waveform according to the modulated first voltage;
 a second rectifier, configured to rectify the second voltage to output a third voltage with a third pulsating waveform;
 a first charging interface, coupled with the second rectifier;
 a first current sampling circuit, configured to sample a current outputted by the second rectifier to obtain a current sampling value, wherein the first current sampling circuit comprises an operational amplifier with an adjustable amplification factor; and
 a control unit, coupled to the first current sampling circuit and the switch unit respectively, and configured to output the control signal to the switch unit, to adjust the amplification factor of the operational amplifier according to a charging mode, and to adjust a duty ratio of the control signal according to the current sampling value, such that the third voltage meets a charging requirement;
 the system further comprises a terminal, the terminal comprises a second charging interface and a battery, the second charging interface is coupled to the battery, wherein the second charging interface is configured to apply the third voltage to the battery when the second charging interface is coupled to the first charging interface.

2. A power adapter, comprising a first rectifier configured to rectify an input alternating current to output a first voltage with a first pulsating waveform, wherein the power adapter further comprises:
 a switch unit, configured to modulate the first voltage according to a control signal;
 a transformer, configured to output a second voltage with a second pulsating waveform according to the modulated first voltage;
 a second rectifier, configured to rectify the second voltage to output a third voltage with a third pulsating waveform;
 a first charging interface, coupled with the second rectifier, and configured to apply the third voltage to a battery of terminal when the first charging interface is coupled with a second charging interface of the terminal, in which the second charging interface is coupled with the battery;
 a first current sampling circuit, configured to sample a current outputted by the second rectifier to obtain a current sampling value, wherein the first current sampling circuit comprises an operational amplifier with an adjustable amplification factor; and
 a control unit, coupled to the first current sampling circuit and the switch unit respectively, and configured to output the control signal to the switch unit, to adjust the amplification factor of the operational amplifier according to a charging mode, and to adjust a duty ratio of the control signal according to the current sampling value, such that the third voltage meets a charging requirement.

3. The power adapter according to claim 2, wherein,
 the first charging interface comprises: a power wire, configured to charge the battery; and a data wire, configured to communicate with the terminal;
 the control unit is configured to communicate with the terminal via the first charging interface to determine a charging mode, in which the charging mode comprises a first charging mode and a second charging mode.

4. The power adapter according to claim 3, wherein the control unit is further configured to:
 decrease the amplification factor of the operational amplifier when determining to charge the terminal in the first charging mode by performing a bidirectional communication with the terminal via the data wire of the first charging interface, so as to prevent saturation of the operational amplifier; and
 increase the amplification factor of the operational amplifier when determining to charge the terminal in the second charging mode by performing the bidirectional communication with the terminal via the data wire of the first charging interface, so as to increase a current detection precision of the first current sampling circuit.

5. The power adapter according to claim 2, wherein,
 the first current sampling circuit further comprises:
 a first resistor, comprising: an end coupled to an output end of the second rectifier;
 a second resistor, comprising: an end coupled to the end of the first resistor and the output end of the second rectifier respectively; and the other end coupled to a first input end of the operational amplifier; wherein the other end of the second resistor is further grounded via a first filtering capacitor; and
 a third resistor, comprising: an end coupled to the other end of the first resistor; and the other end coupled to a second input end of the operational amplifier; wherein the other end of the third resistor is further grounded via a second filtering capacitor;
 wherein an adjusting end of the operational amplifier is coupled to the control unit.

6. The power adapter according to claim 3, wherein when determining to charge the terminal in the first charging mode by performing the bidirectional communication with the terminal via the data wire of the first charging interface,
 the control unit is configured to send a first instruction to the terminal, in which the first instruction is configured to query the terminal whether to operate in the first charging mode; and
 the control unit is configured to receive a reply instruction of the first instruction from the terminal, in which the reply instruction of the first instruction is configured to indicate that the terminal agrees to operate in the first charging mode.

7. The power adapter according to claim 6, wherein, before the control unit sends the first instruction to the terminal, the power adapter is configured to charge the terminal in the second charging mode, and the control unit is configured to send the first instruction to the terminal when determining that a charging duration of the second charging mode is greater than a predetermined threshold.

8. The power adapter according to claim 6, wherein the control unit is further configured to control the power adapter to adjust a charging current to a charging current in the first charging mode by controlling the switch unit, and before the power adapter charges the terminal with the charging current in the first charging mode, the control unit is configured to perform the bidirectional communication with the terminal via the data wire of the first charging interface to determine a charging voltage in the first charging mode, and to control the device to adjust a charging voltage to the charging voltage in the first charging mode.

9. The power adapter according to claim 8, wherein when performing the bidirectional communication with the terminal via the data wire of the first charging interface to determine the charging voltage in the first charging mode, the control unit is configured to send a second instruction to the terminal, in which the second instruction is configured to query whether a current output voltage of the device is suitable as the charging voltage in the first charging mode;

the control unit is configured to receive a reply instruction of the second instruction sent from the terminal, in which the reply instruction of the second instruction is configured to indicate that the current output voltage of the device is suitable, high or low; and the control unit is configured to determine the charging voltage in the first charging mode according to the reply instruction of the second instruction.

10. The power adapter according to claim 8, wherein, the control unit is further configured to perform the bidirectional communication with the terminal via the data wire of the first charging interface to determine the charging current in the first charging mode.

11. The power adapter according to claim 10, wherein, when performing the bidirectional communication with the terminal via the data wire of the first charging interface to determines the charging current in the first charging mode, the control unit is configured to send a third instruction to the terminal, in which the third terminal is configured to query a maximum charging current currently supported by the terminal;

the control unit is configured to receive a reply instruction of the third instruction sent from the terminal, in which the reply instruction of the third instruction is configured to indicate the maximum charging current currently supported by the terminal; and the control unit is configured to determine the charging current in the first charging mode according to the reply instruction of the third instruction.

12. The power adapter according to claim 6, wherein during a process that the power adapter charges the terminal in the first charging mode, the control unit is further configured to perform the bidirectional communication with the terminal via the data wire of the first charging interface, so as to continuously adjust a charging current outputted to the battery from the power adapter by controlling the switch unit.

13. The power adapter according to claim 12, wherein, when performing the bidirectional communication with the terminal via the data wire of the first charging interface to continuously adjust the charging current outputted to the battery from the power adapter by controlling the switch unit, the control unit is configured to send a fourth instruction to the terminal, in which the fourth instruction is configured to query a current voltage of the battery in the terminal;

the control unit is configured to receive a reply instruction of the fourth instruction sent by the terminal, in which the reply instruction of the fourth instruction is configured to indicate the current voltage of the battery in the terminal; and the control unit is configured to adjust the charging current by controlling the switch unit according to the current voltage of the battery.

14. The device according to claim 13, wherein the control unit is configured to adjust the charging current outputted to the battery from the power adapter to a charging current value corresponding to the current voltage of the battery by controlling the switch unit according to the current voltage of the battery and a predetermined correspondence between battery voltage values and charging current values.

15. The power adapter according to claim 12, wherein, during the process that the power adapter charges the terminal in the first charging mode, the control unit is further configured to perform the bidirectional communication with the terminal via the data wire of the first charging interface, to determine whether the first charging interface and the second charging interface are in poor contact;

wherein, when determining that the first charging interface and the second charging interface are in poor contact, the control unit is configured to control the device to quit the first charging mode.

16. The power adapter according to claim 15, wherein, the control unit is further configured to receive information indicating path impedance of the terminal from the terminal before determining whether the first charging interface and the second charging interface are in poor contact, wherein the control unit is configured to send a fourth instruction to the terminal, in which the fourth instruction is configured to query a current voltage of the battery in the terminal;

the control unit is configured to receive a reply instruction of the fourth instruction sent by the terminal, in which the reply instruction of the fourth instruction is configured to indicate the current voltage of the battery in the terminal;

the control unit is configured to determine path impedance from the power adapter to the battery according to an output voltage of the power adapter and the current voltage of the battery; and the control unit is configured to determine whether the first charging interface and the second charging interface are in poor contact according to the path impedance from the power adapter to the battery, the path impedance of the terminal, and path impedance of a charging circuit between the power adapter and the terminal.

17. The power adapter according to claim 16, wherein, before the power adapter quits the first charging mode, the control unit is further configured to send a fifth instruction to the terminal, in which the fifth instruction is configured to indicate that the first charging interface and the second charging interface are in poor contact.

18. A charging method for a terminal, comprising:

when a first charging interface of a power adapter is coupled with a second charging interface of the terminal, performing a first rectification on an input alternating current to output a first voltage with a first pulsating waveform;

modulating the first voltage by controlling a switch unit, and outputting a second voltage with a second pulsating waveform by a conversion of a transformer;

performing a second rectification on the second voltage to output a third voltage with a third pulsating waveform, and applying the third voltage to a battery of the terminal via the second charging interface;

sampling by a first current sampling circuit a current after the second rectification to obtain a current sampling value, wherein the first current sampling circuit comprises an operational amplifier with an adjustable amplification factor; and adjusting the amplification factor of the operational amplifier according to a charging mode, adjusting a duty ratio of a control signal outputted to the switch unit according to the current sampling value, such that the third voltage meets a charging requirement.

19. The charging method according to claim 18, further comprising:

communicating with the terminal via the first charging interface to determine a charging mode, in which the charging mode comprises a first charging mode and a second charging mode.

20. The charging method according to claim 19, further comprising:

decreasing the amplification factor of the operational amplifier when determining to charge the terminal in the first charging mode by performing a bidirectional communication with the terminal via the data wire of the first charging interface, so as to prevent saturation of the operational amplifier; and increasing the amplification factor of the operational amplifier when determining to charge the terminal in the second charging mode by performing the bidirectional communication with the terminal via the data wire of the first charging interface, so as to increase a current detection precision of the first current sampling circuit.

* * * * *